United States Patent

Yamaoka et al.

[11] Patent Number: 6,066,891
[45] Date of Patent: May 23, 2000

[54] ELECTRODE FOR SEMICONDUCTOR DEVICE INCLUDING AN ALLOY WIRING LAYER FOR REDUCING DEFECTS IN AN ALUMINUM LAYER AND METHOD FOR MANUFACTURING THE SAME

[75] Inventors: Tooru Yamaoka, Toyohashi; Atsushi Komura, Obu; Takeshi Yamauchi, Nagoya; Yoshihiko Isobe, Toyoake; Hiroyuki Yamane, Anjo, all of Japan

[73] Assignee: Nippondenso Co., Ltd, Kariya, Japan

[21] Appl. No.: 08/802,214

[22] Filed: Feb. 19, 1997

Related U.S. Application Data

[63] Continuation of application No. 08/431,044, Apr. 28, 1995, abandoned.

[30] Foreign Application Priority Data

Apr. 28, 1994 [JP] Japan .................................. 6-090926
Jun. 28, 1994 [JP] Japan .................................. 6-146289

[51] Int. Cl.$^7$ .......................... H01L 23/48; H01L 23/52; H01L 29/40
[52] U.S. Cl. .......................... 257/751; 257/750; 257/758
[58] Field of Search .................................. 257/764, 915, 257/763–765, 751–753, 911, 758; 438/643

[56] References Cited

U.S. PATENT DOCUMENTS

| | | | |
|---|---|---|---|
| 4,141,022 | 2/1979 | Sigg et al. ................................ | 257/384 |
| 4,887,146 | 12/1989 | Hinode .................................... | 257/915 |
| 4,989,064 | 1/1991 | Kubokoya et al. . | |
| 5,049,975 | 9/1991 | Ajika et al. ............................. | 257/915 |
| 5,202,579 | 4/1993 | Fujii et al. ............................... | 257/751 |
| 5,236,869 | 8/1993 | Takagi et al. ............................ | 438/643 |
| 5,345,108 | 9/1994 | Kikkawa ................................... | 257/751 |
| 5,427,666 | 6/1995 | Mueller et al. ......................... | 438/643 |
| 5,459,353 | 10/1995 | Kanazawa ................................ | 257/764 |
| 5,589,713 | 12/1996 | Lee et al. ................................ | 257/773 |

FOREIGN PATENT DOCUMENTS

| | | |
|---|---|---|
| 0430403 | 6/1991 | European Pat. Off. ............... 257/915 |
| 0525637 | 2/1993 | European Pat. Off. . |
| 0152147 | 6/1988 | Japan . |
| 0003395 | 1/1991 | Japan . |
| 0262127 | 11/1991 | Japan . |
| 0042537 | 2/1992 | Japan . |
| 0074961 | 3/1993 | Japan . |
| 0151815 | 5/1994 | Japan . |
| 6-275555 | 9/1994 | Japan . |

OTHER PUBLICATIONS

Proceedings of the European Solid State Device Research Conference (ESSDERC), Leuven, Sep. 14–17, 1992, No. Conf. 22, Sep. 14, 1992, Maes H E; Mertens R P; Van Overstraeten R J, pp. 371–374, XP000357114 Wendt H: "Process Integration for Barrier Layers and Al–Alloys Using a Sputtering Cluster Tool".
Patent Abstracts of Japan vol. 12, No. 402 (E–673), Oct. 25, 1988 & JP 63 142832 A (Fujitsu Ltd), Jun. 15, 1988.

(List continued on next page.)

*Primary Examiner*—Minh Loan Tran
*Assistant Examiner*—Cuong Quang Nguyen
*Attorney, Agent, or Firm*—Pillsbury Madison & Sutro LLP

[57] ABSTRACT

The purpose of the present invention is to obtain an electrode wiring structure for semiconductor devices that can suppress the occurrence of Al voids inside aluminum alloy wiring without regard to the orientation of such aluminum alloy wiring. An interlayer insulator film 11, a titanium layer 12, a titanium nitride layer 13 that serves as the barrier layer, an aluminum alloy wiring layer 15 and a protective film 18 are formed on top of the silicon substrate 10 to compose the electrode structure. In this case, a distortion relaxation layer 14, with a film thickness of approximately over 10 nm and which is an intermetallic compound that includes aluminum and titanium in its composition, is formed in between the titanium nitride layer 13 and the aluminum alloy wiring layer 15. Because of this distortion relaxation layer, for every wiring width of 1 μm, the number of Al voids with widths of over 0.3 μm is practically reduced to 0.

26 Claims, 17 Drawing Sheets

OTHER PUBLICATIONS

IBM Technical Disclosure Bulletin, vol. 25, No. 12, May 1983, New York US, pp. 6398–6399, XP002029264 C.Y. Ting: "New structure for contact metallurgy".

Japanese Journal of Applied Physics, vol. 31, No. 5A, May 1, 1992. pp. 1446–1452, XP000355399 Ping Jin et al: "Bais Effect on the Microstructure and Diffusion Barrier Capability of Sputtered Tin and Tioxny Films".

Koubuchi, et al: "Effects of Si on electromigration of Al–CuSi/Tin layered metallization", J. Voc. Sci. Technol.B vol. 10, No. 1, Jan/Feb 1992, pp. 143–148.

Kikkawa: "A Quarter–Micrometer Interconnection Technology Using a Tin/Al–Si–Cu/Tin/Al–Si–Cu/Tin/Ti Multilayer Structure" IEEE Transactions on Electron Devices, vol. 40 No. 2, Feb. 1993, pp. 296–302.

Mandi et al: "Diffusion barrier properties on Ti/Tin investigated by transmission electron microscopy", J. App. Phys. 66 (5), Sep. 1, 1990, pp. 2127–2132.

Soube, et al: "Metastable Phase Formation in Al alloy/Tin/Ti/Si System", First International Symposium on Control of Semiconductor Interfaces, Nov. 11, 1993.

Pramanik, et al: "Barrier Metal for ULSI—its Manufacturing Process and Reliability", Solid State Technology, (Japanese edition), Jul. 1991, pp. 23–28.

WIDTH OF Al VOID

ELECTRODE FOR SEMICONDUCTOR DEVICE INCLUDING AN ALLOY WIRING LAYER FOR REDUCING DEFECTS IN AN ALUMINUM LAYER AND METHOD FOR MANUFACTURING THE SAME

This is a continuation of application Ser. No. 08/431,044, filed on Apr. 28, 1995, now abandoned.

CROSS REFERENCE TO RELATED APPLICATION

This application is based upon and claims the benefit of priority of the prior Japanese Patent applications No. 6-90926 filed on Apr. 28, 1994 and No. 6-146289 filed on Jun. 28, 1994.

BACKGROUND OF THE INVENTION

1. Field of the Invention

The present invention relates to a wiring electrode for semiconductors and a manufacturing method thereof. Particularly, the present invention relates to a metal system of an electrode which has an aluminum alloy wiring layer (hereinafter, referred as an Al alloy layer) and can reduce the defects (called Al void) that occur within Al alloy layers due to the miniaturization.

2. Related Arts

In recent years, with the advancements in technology for integrating elements, technologies for miniaturization and multilayering have become essential. As miniaturization advances, the need to design finer widths for the wiring in the Al alloy layer arises. But, as shown in FIG. 4, as the wire widths become finer than 2 $\mu$m or 3 $\mu$m, especially less than 1 $\mu$m, Al voids are known to occur inside the Al alloy layer. Such Al voids are generated as a stress migration due to the tensile stress which occurs inside the Al alloy layer during heat treatment. Also, the Al voids occur when various thin films are multilayered because such multilayered structure causes tensile stress inside the element.

If these Al voids become significantly large, the reliability factor becomes a big problem. For example, the following problems may occur: disconnection of the Al alloy wiring; increase in the wiring resistance due to the reduction in the cross section of the Al alloy layer; destruction of the elements due to heat generation; delays in the operation speed; electromigration due to the application of large current and the like.

One conventional method, that has been used to reduce the occurrences of Al void is to mix copper in the aluminum and silicon (Al—Si) wiring electrode to form the Al—Si—Cu wiring, wherein the copper acts to hinder the movement of the Al atoms.

Such wiring electrode is disclosed in JP-A-63-152147. The publication discloses that, if the crystal surface of the Al—S—Cu wiring is oriented at the (111) plane, the occurrence of Al voids is further reduced. In other words, as the (111) plane is filled most densely with Al atoms, the movement of an Al atom is restrained by the other Al atoms, or movement of the Al atoms for easing the tensile stress inside the Al alloy layer is restrained, which leads to fewer occurrences of Al voids.

However, the (111) plane orientation of the Al—Si—Cu wiring has a close relation to the underlying crystal structure. For example, as disclosed in JP-B-3-3395, JP-A-4-42537 and JP-A-3-262127, it has been discovered that it is difficult to properly orient the crystal surface of the Al alloy when a metallic nitride film of high melting point, like a titanium nitride (TiN) layer, is interposed under the Al alloy layer as a barrier metal.

Thus, for the wiring electrode disclosed in JP-A-63-152147, the underlying crystal structure needs to be supervised carefully to improve the orientation of the Al—Si—Cu wiring, and because of this, improvements in the productivity cannot be expected.

SUMMARY OF THE INVENTION

The present invention, which has been done in consideration with the above problem, aims to provide an electrode structure that can curb the occurrences of Al voids inside Al alloy layers, irrespective of the orientation of an Al alloy layer which is located over a titanium nitride layer.

To achieve the above objective, the inventors of the present invention have investigated, based on the manufacturing conditions and the like, methods which can curb the occurrences of Al voids in Al alloy layers irrespective of their orientation. From these investigations, it was discovered that the layer formation conditions of the titanium nitride layer, which was assumed to have no relation whatsoever with the occurrence of the Al voids, can drastically reduce the occurrences of Al voids.

The present invention is based on the information gathered by the inventors from the results of their investigations and an electrode structure according to the invention has the following characteristics: it is constructed on a semiconductor substrate, with an interlayer insulator film which has an aperture corresponding to a contact area of the substrate; a barrier layer, whose composition includes titanium nitride, contacts the semiconductor substrate via the aperture of the interlayer insulator film; an aluminum alloy wiring layer is formed over the barrier layer; and a distortion relaxation layer is formed between the barrier layer and the aluminum alloy wiring layer with a film that has a thickness of over 10 nm and made up of an intermetallic compound, whose composition includes at least aluminum and titanium.

By placing the distortion relaxation layer with a thick film (10 nm or more), the distortion, acting inside the aluminum alloy wiring layer, is eased and thus, irrespective of the orientation of the aluminum alloy wiring layer, occurrences of Al voids inside the Al alloy wiring layer can be suppressed.

Or, it may be that the present invention has the following features: for every 1 $\mu$m of the line width of the aluminum alloy wiring layer, the thickness of the distortion relaxation layer, which is an intermetallic compound including aluminum and titanium and which is to be placed between the barrier layer and the aluminum alloy wiring layer, is set so that the Al voids, the width of which is over 0.3 $\mu$m, can be effectively be made zero. In other words, the distortion relaxation layer preferably has a thickness which can suppress the occurrence of the Al void the width of which is approximately one third or more of the line width of the aluminum alloy wiring layer. Such film thickness according to the present invention, which was unachievable in the reactant layer formed through the reaction of the titanium nitride and aluminum alloy wiring layers when the conventional method is performed, make it possible to enable the drastic reduction of Al voids.

In addition, it is desirable that the distortion relaxation layer be formed to cover at least 40% of the interface between the barrier layer and the aluminum alloy layer.

Moreover, the distortion relaxation layer can either be a $Al_3Ti$ layer or an intermetallic compound that contains Al$_3$Ti. Ti contained in the titanium nitride layer can enter between the aluminum lattices and constitute the distortion relaxation layer of Al$_3$Ti or an intermetallic compound containing Al$_3$Ti, the distortion due to the tensile stress that occurs inside the aluminum alloy wiring layer is eased. Consequently, irrespective of the orientation of the aluminum alloy wiring layer, the occurrences of Al voids inside Al alloy layer can be suppressed.

Furthermore, it is desirable that the oxygen levels at the inside of the barrier layers and at the interface of the barrier layer and the distortion relaxation layer be under 1 at %. Because of such, it would be easier for aluminum (Al) and titanium (Ti) to react to each other.

Moreover, by providing an alloy spike preventive layer between the barrier layer and the semiconductor substrate, the occurrences of Al voids can be curbed while at the same time suppressing the occurrence of alloy spikes. For this case, the first titanium nitride layer is positioned as the barrier layer and a second titanium nitride layer, with different matter properties from the first one, is placed as the alloy spike preventive layer. With, this kind of structure, titanium nitride layers made of the same material can be used to suppress the occurrences of both Al voids and alloy spikes at the same time.

Next, a manufacturing method according to the present invention, for making a wiring electrode basically has the following steps: a step of forming an interlayer insulator film on a semiconductor substrate; a step of forming an opening on the interlayer insulator film which exposes the surface of the substrate; a step of forming a first titanium nitride layer on the interlayer insulator film such that the first titanium nitride layer contacts the surface of the substrate via the opening; a step of forming an aluminum alloy wiring layer on the first titanium nitride layer; and a step of performing a heat treatment after the formation of the aluminum alloy wiring layer. In this arrangement, the manufacturing method according to the present invention is further characterized in that: the step of forming the first titanium nitride layer is carried out through reactive sputtering, wherein titanium is targeted inside the sputtering device supplied with nitrogen gas and under the condition that the DC power density is 5.5 W/cm$^2$ or less; and further, the steps for forming the first titanium nitride layer and the aluminum alloy wiring layer are continuously performed while maintaining a vacuum.

By forming the first titanium nitride layer with the DC power density is below 5.5 W/cm$^2$ and at the same time, performing the formation of the films of the first titanium nitride and aluminum alloy layers continuously inside a vacuum, reaction between the first titanium nitride and aluminum alloy layers would be promoted and thus, a distortion relaxation layer with a thick film can be realized.

Also, for the first titanium nitride film obtained immediately after the film formation, it is desirable for it to have a resistivity of from 180 $\mu\Omega$cm to 1,000 $\mu\Omega$cm and to have a compressive stress of from 0 to 90 MPa.

Furthermore, by only adding a step of forming a second titanium nitride layer, which prevents alloy spikes, over the surface exposed in the opening of the interlayer insulation film before the formation of the first titanium nitride layer, the occurrences of Al voids and alloy spikes can be suppressed simultaneously as explained above. In this case, because both the first and second layers are made of the same titanium nitride material, the manufacturing steps thereof can be simplified.

Moreover, it is desirable that the step of forming the second titanium nitride layer be formed using a reactive sputtering method performed such that the DC power density inside the sputtering device is set over 6.96 W/cm$^2$. By forming the second titanium nitride layer in this manner, the second titanium nitride layer can be made to function as an alloy spike preventive layer which further reduces the occurrences of alloy spikes.

BRIEF DESCRIPTION OF THE DRAWINGS

These and other objects, features and characteristics of the present invention will be appreciated from a study of the following detailed description, the appended claims, and drawings, all of which form a part of this application. In the drawings:

FIGS. 24A and 24B are graphs each showing an analysis of the composite distribution, obtained through an Auger Electron Spectroscopic device, of a wiring electrode, wherein FIG. 24A shows a case that an alloy spike-preventive titanium nitride layer is formed as a barrier layer and FIG. 24B shows a case that an Al void-preventive titanium nitride layer is formed as a barrier layer;

DETAILED DESCRIPTION OF THE PRESENTLY PREFERRED EXEMPLARY EMBODIMENTS (First Embodiment)

Figure 1:
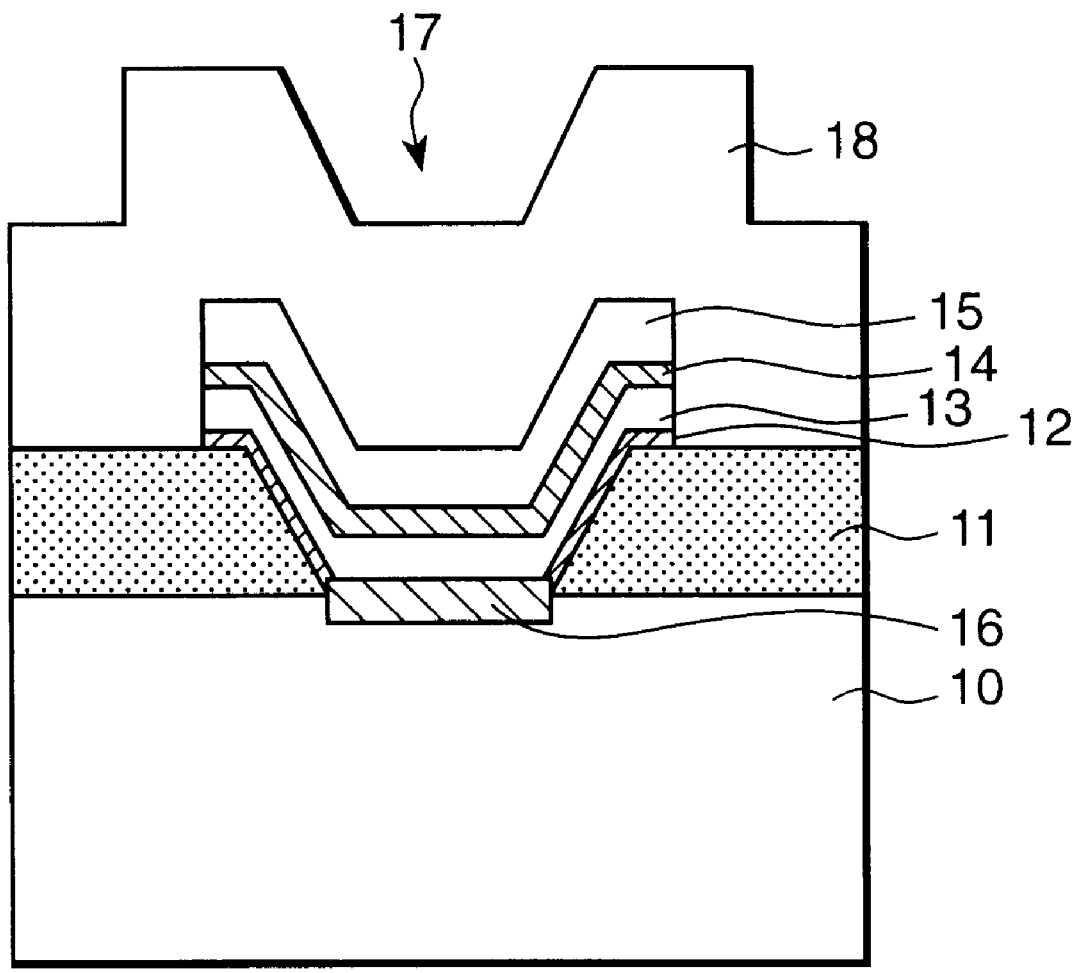
FIG. 1 is a cross-sectional view of an electrode structure for wiring according to a first embodiment of the present invention.

FIG. 1 is a cross-sectional view of the semiconductor device that has the electrode structure according to the first embodiment and shows the surrounding area of a contact hole 17. Formed on a silicon (semiconductor) substrate 10 are an interlayer insulator film 11, which has apertures as the contact hole 17, and a titanium layer 12. A titanium silicide layer 16 is formed between the titanium layer 12 and silicon substrate 10. Also, on top of the titanium layer 12 and the titanium silicide 16, a titanium nitride layer 13 as a barrier layer is formed, and further, an Al alloy layer 15 composed of Al—Si(1.0 wt %)—Cu(0.5 wt %) and a protective film 18 of an insulating film are formed thereabove.

Figure 16:
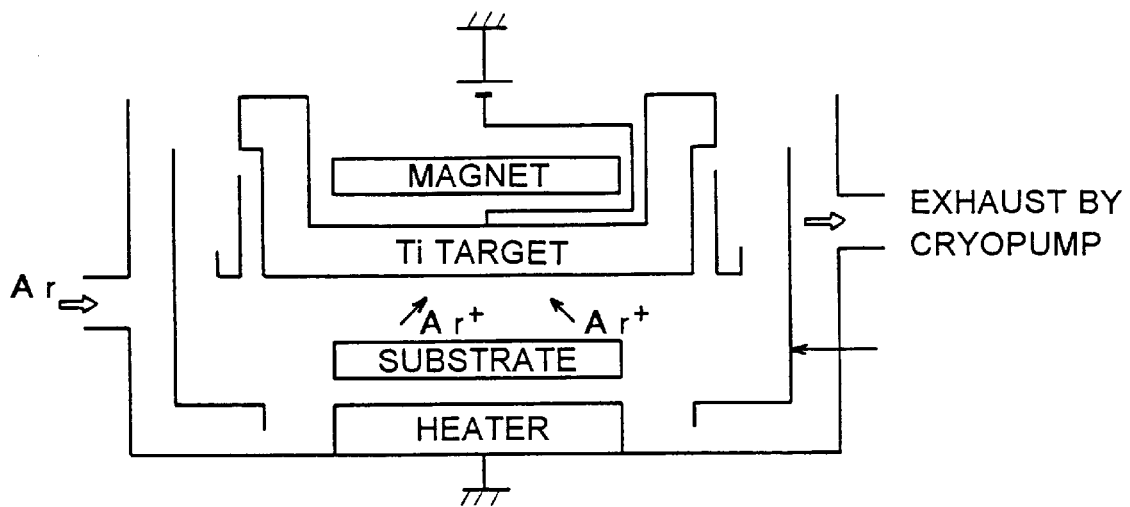
FIG. 16 is a diagram showing the structure of the sputtering device.

To make this kind of wiring electrode, after forming the titanium layer 12, the titanium nitride layer 13 and the Al alloy layer 15 on top of the silicon substrate 10, an annealing process is performed to reduce the resistance of the contact area of the substrate with the electrode system, and after which, the protective film 18 is formed. Here, the DC magnetron sputtering device shown in FIG. 16 is used in forming the titanium layer 12 and titanium nitride layer 13. That is, argon (Ar) gas is supplied inside the chamber of the sputtering device, and voltage is applied between the Ti target and the heater. In this way, the Ti targets are sputtered by the Ar ions and Ti film is deposited on the wafer (substrate). Of nitrogen gas reactant, $N_2$, is introduced while Ti is being deposited, the nitrogen will react with the Ti to thereby form TiN on top of the substrate.

Figure 3:
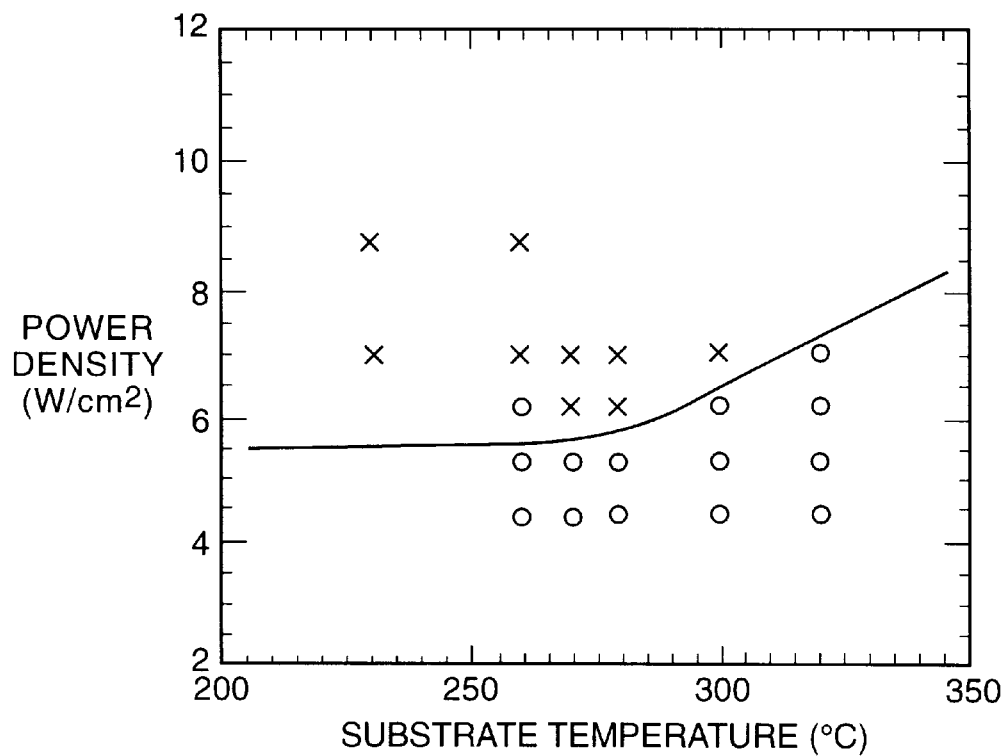
FIG. 3 is a graph showing the relationship between the conditions for the film formation of the titanium nitride layer and the occurrence of Al voids.
Figure 4:
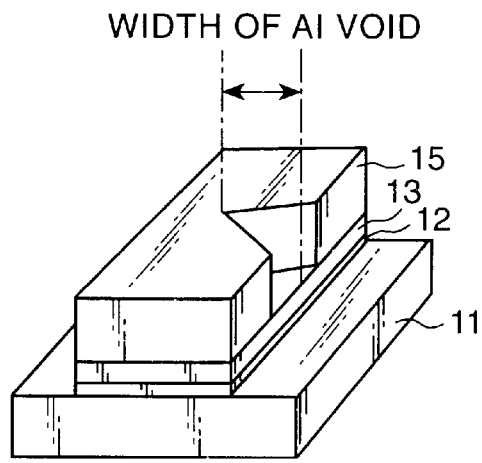
FIG. 4 is a view showing the electrode with an Al void, together with an indication of the width of the Al void.

Here, the inventors varied the conditions, which are the DC power density (obtained by dividing the electric power applied between the Ti target and the heater with the Ti target's area) and the heater temperature during the film formation of the TiN (referred to as substrate temperature), for the film formation of the TiN to observe and examine the occurrences of Al voids. The results of their study are shown in FIG. 3. In FIG. 3, the ○ symbol refers to the sample with an aluminum wiring width of 1 μm in which Al voids the widths of which are over 0.3 μm were not discovered. On the other hand, the X symbol refers to the sample with aluminum wiring width of 1 μm in which Al voids the widths of which are over 0.3 μm were discovered. Here, Al void width is defined in FIG. 4. From the relationship shown in FIG. 3, the occurrences of Al voids are remarkably reduced for the region below the solid line marked as the border in the graph. Particularly, it must be noted that when the DC power density is 5.5 W/cm² or below, the occurrences of Al voids can be restrained, regardless of the substrate temperature during the TiN film formation.

Examining the above, when forming a wiring electrode, titanium diffuses from the titanium nitride layer to the Al alloy layer during the annealing process (400° C.–480° C.), which is performed to reduce the electrical connection resistance after the formation of Al alloy layer, or during heat treatment (300° C.–480° C.), which is performed during and after the formation of the protective film, and thereby the following reaction occurs to form an intermediate layer.

$$Al + TiN \rightarrow AlN + Ti \quad (1)$$

$$Ti + xAl \rightarrow TiAl_x \quad (2)$$

(Here, x refers to an arbitrary number.)

Because of the occurrence of the reactions shown in equations (1) and (2), a Ti diffusion layer (referred to as the distortion (or stress) relaxation layer) is formed inside the Al alloy, and with such, it can be thought of that distortion inside the Al alloy is relaxed and that the formation of Al voids is suppressed.

In other words, in FIG. 1, annealing the titanium nitride layer 13 and the Al alloy layer 15 results in the reduction of TiN by Al and the production of Ti. This Ti diffuses inside the Al alloy layer 15 in such a manner that the distortion inside the Al alloy layer is scattered and thus from this, it can be thought of that the distortion relaxation layer 14 is formed. That is, if there is distortion inside the Al alloy layer due to tensile stress, the diffused Ti enters the spaces between the Al lattices and widens such spaces to relax the distortion and thus form the distortion relaxation layer 14. Because of this distortion relaxation layer, distortion is relieved and, as a result, the occurrence of Al voids inside Al alloy layer 15 is suppressed, regardless of the orientation of the Al alloy layer 15.

While it is known that the Al voids are the result of stress induced migration which occurs when tensile stress, during the heating process, is applied to the inside part of the Al alloy, the mechanism described above for suppressing the occurrences of Al voids works when Ti scatters from the titanium nitride layer 13 to the Al alloy layer 15 and forms a distortion relaxation layer 14, which relaxes the tensile distortion inside the Al alloy layer and thereby suppresses the occurrences of Al voids.

The distortion relaxation layer 14 must have a sufficient thickness to suppress the occurrences of Al voids. If the electrode has a TiN/Al structure, the reaction described above is thought to occur because of the annealing process after the deposition of Al. While that is the case, it can be inferred that the film layer, produced by the reaction, cannot function well as a distortion relaxation layer if it is a thin one. In short, even if the diffusion of Ti to the inside part of Al alloy layer occurs, if the layer produced by the reaction is very thin, then such layer is not such one that can suppress the occurrences of Al voids. This matter can be ascertained from the analogy of the results in FIG. 3. As shown in FIG. 3, even for the same film formation structure, there are differences in the occurrences of Al voids. It can be thought of that this is due to the fact that the thickness of the diffusion layer, caused when Ti is diffused to the inside of the Al alloy layer, differs with the varying conditions of forming the TiN film.

Figure 5:
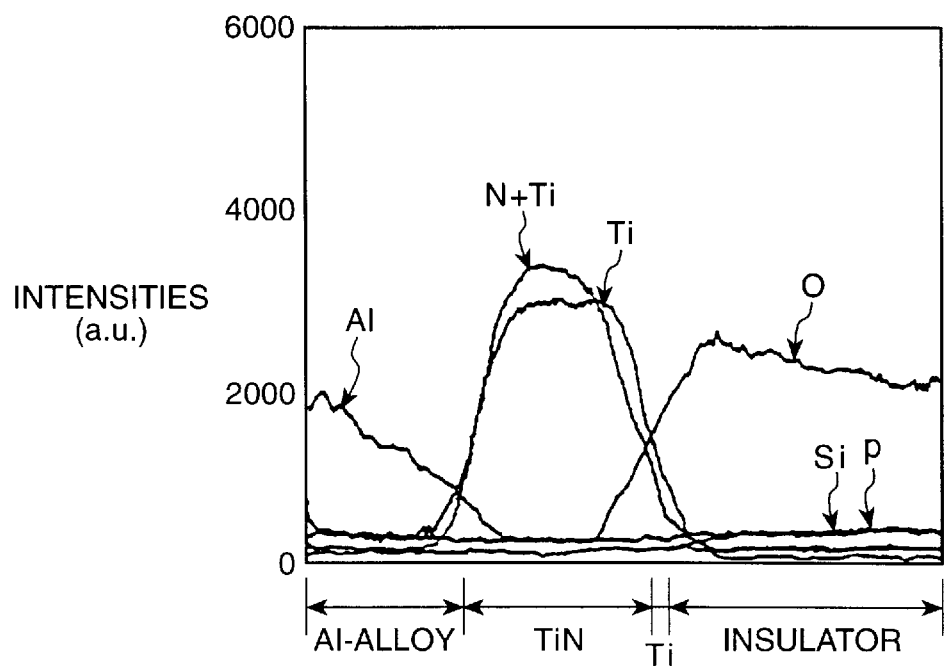
FIG. 5 is a graph showing an analysis of the composite distribution, obtained through an Auger Electron Spectroscopic device, of a wiring electrode with Al voids.
Figure 6:
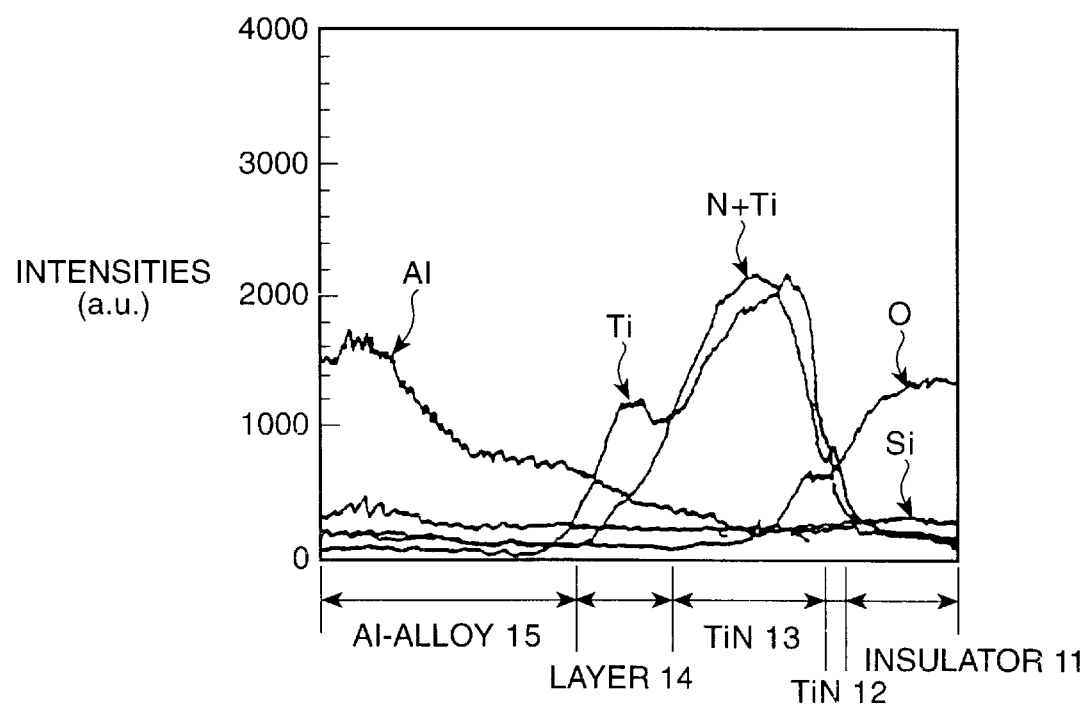
FIG. 6 is a graph showing an analysis of the composite distribution, obtained through an Auger Electron Spectroscopic device, of the wiring electrode in FIG. 1.

The inventors, using the Auger Electron Spectroscopic device, analyzed the respective compositions of the samples on which Al voids occurred and the samples on which Al voids were suppressed. FIGS. 5 and 6 show the analysis results focusing along the depth of the part where the interlayer insulator film is formed. Both profile in FIGS. 5 and 6 show the composition along the different depths together with the distribution of the component elements after annealing which is performed after the film formation of the Al alloy. FIG. 5 shows the examination results for those samples marked as X in FIG. 3 while FIG. 6 shows the results for those samples marked as ○ in FIG. 3. Compared to those samples shown in FIG. 5 which had Al voids, the samples, shown in FIG. 6, which suppressed the occurrences of Al voids, had a Ti diffusion layer acting as a distortion relaxation layer inside the Al alloy. These produced Ti diffusion layers were confirmed to have considerable thickness.

Thus, if the diffusion layer formed when Ti diffuses to the inside part of the Al alloy layer is very thin, then, as in the samples marked as X in FIG. 3, Al voids will occur. From this result, the distortion relaxation layer 14, per 1 $\mu$m of the wiring width, has to have a thickness that reduces the over 0.3 $\mu$m widths of Al voids to practically zero. In other words, the distortion relaxation layer 14 has to have a thickness that reduces the Al voids, the width of which are over $\frac{1}{3}$ as large as the width of the wiring, to practically zero.

Also, as in the past, to prevent the elements of the Al alloy (Al,Si,etc.) from passing through the barrier metal (so-called alloy spike), the TiN film is exposed to the atmosphere after formation and heated and treated so that oxygen will be contained in the crystal grain boundaries. The inventors have also confirmed the numerous occurrences of Al voids in a case where an Al alloy layer is formed after exposing the formed titanium nitride layer to the atmosphere. This is probably because the oxidation of the surface of the titanium nitride layer has made it hard for the reaction stated before to occur and thus, Ti was not able to diffuse inside the Al alloy. Therefore, as the inventors have detected, it is important to not include oxygen during the formation of the titanium nitride layer and to not expose it to the atmosphere after the formation of TiN but rather, the process of film formation should be done continuously inside a vacuum.

As shown in FIGS. 5 and 6, oxygen was not detected in the interior of the Al alloy and titanium nitride layers, as well as in the interface therebetween. This is the difference with the usual manufacturing processes and is due to the fact that the titanium nitride layer is not exposed to the atmosphere after the film formation thereof. Oxygen detected inside the interlayer insulator film, the titanium layer and interface between the titanium nitride layer and the titanium layer, was due to the presence of $SiO_2$ inside the interlayer insulator film.

Figure 7:
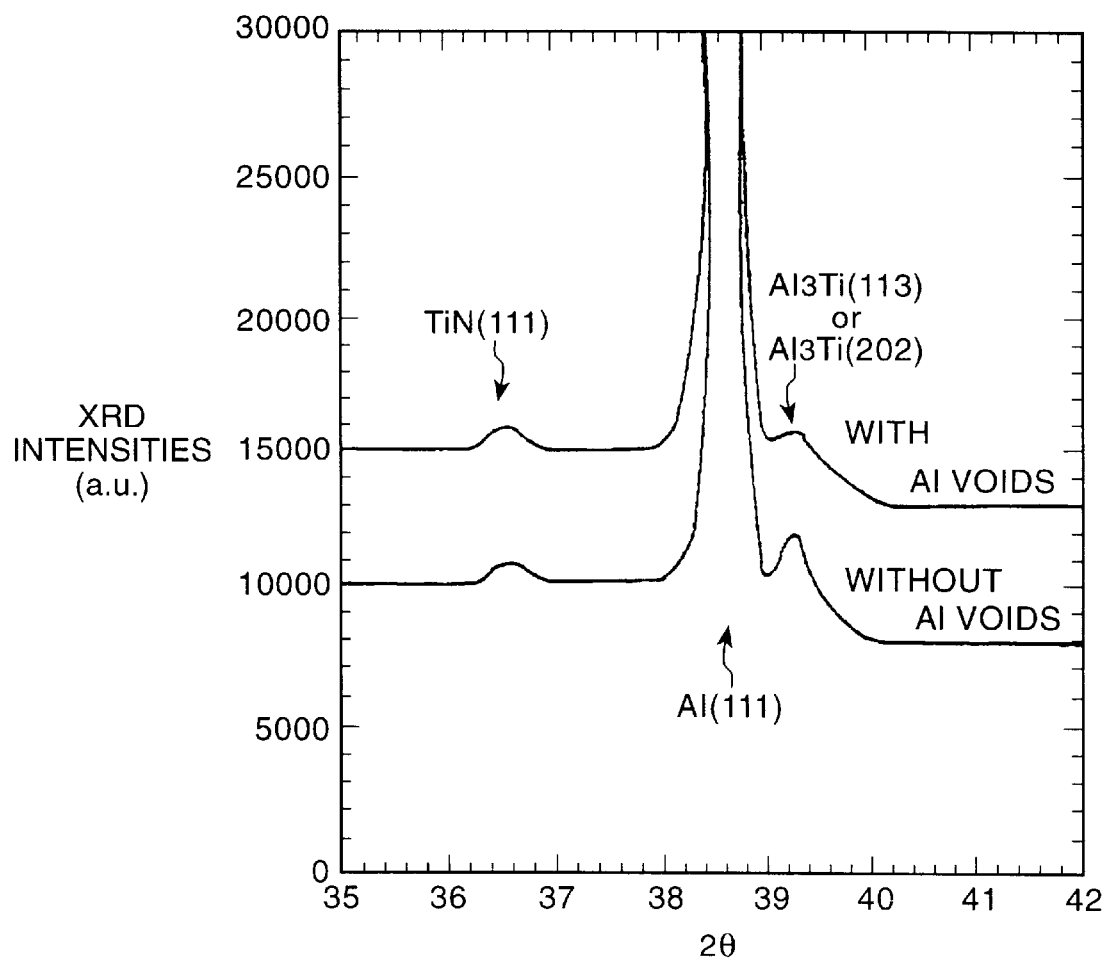
FIG. 7 is a graph showing a X-ray diffractometry results of the wiring electrodes.

Also, X-ray diffractometry was also performed on these samples and as shown in FIG. 7, a broad peak, which indicates the compound $TiAl_x$ whose main component is $TiAl_3$, was detected around the area at which the detected angle 2θ is 39.3°. Furthermore, it was discovered that this peak appears more remarkably for those samples which suppressed Al voids than those samples where Al voids occurred. Therefore, from the results shown in FIGS. 3, and 5–7, it is clear that the intermetallic compound layer between the aluminum and titanium metals, formed by the diffusion of titanium to the inside part of the Al alloy from the titanium nitride layer, suppresses the occurrences of Al voids.

Figure 8:
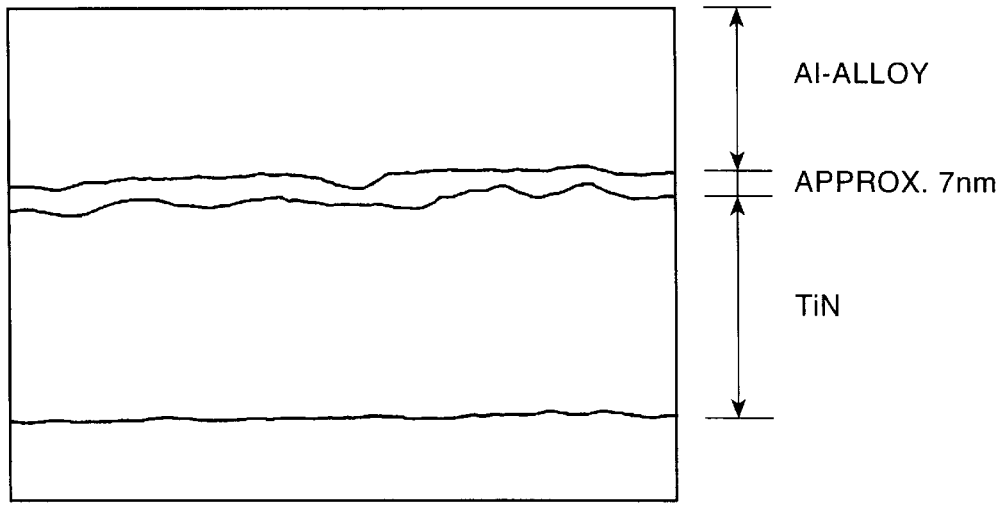
FIG. 8 is a diagram showing the wiring electrode with Al voids as observed through a cross-sectional transmission electron microscopy.
Figure 9:
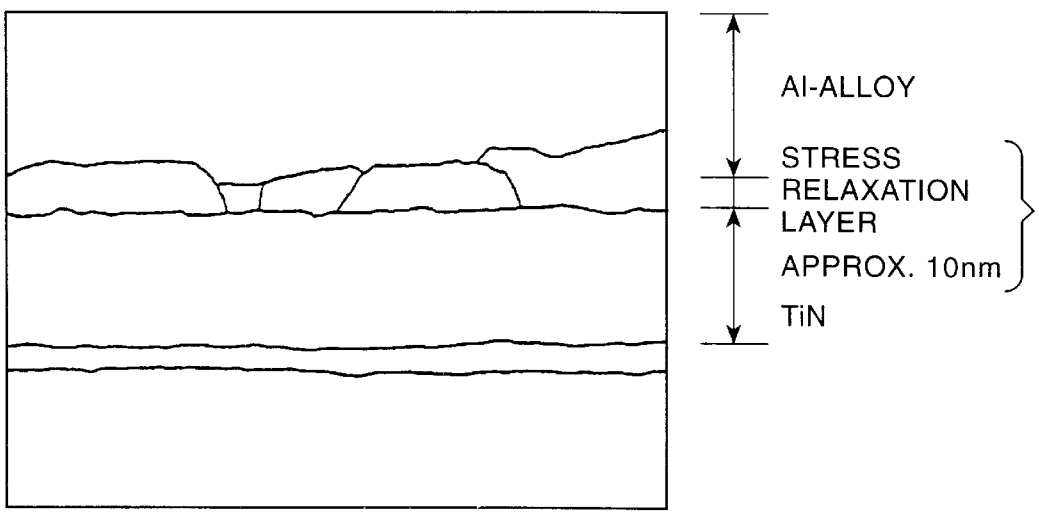
FIG. 9 is a diagram showing the wiring electrode of FIG. 1 as observed through a cross-sectional transmission electron microscopy.

FIGS. 8 and 9 show traces of images of the cross-sectional views of the film of the materials where Al voids occurred (the samples marked as X in FIG. 3) and where such voids' occurrences were suppressed (the samples marked as ○ in FIG. 3), respectively, as observed from a transmission electron microscope. In the material where Al voids occurred, it can be confirmed from FIG. 8 that a layer (referred to as the reaction layer to distinguish it from the distortion relaxation layer stated above) having a thickness at around 7 nm was formed between the Al alloy layer and the titanium nitride layer. On the other hand, as shown in FIG. 9, for the material which suppressed the occurrence of Al voids, a distortion relaxation layer, which is clearly thicker than that in FIG. 8, with a thickness of 10 nm was formed between the Al alloy layer and titanium nitride layer. Therefore, if the distortion relaxation layer 14 has a thickness of 10 nm or more, it is follows that the distortion brought about by the tensile stress inside the Al alloy can be eased enough so that the occurrence of Al voids can be suppressed sufficiently.

Figure 10:
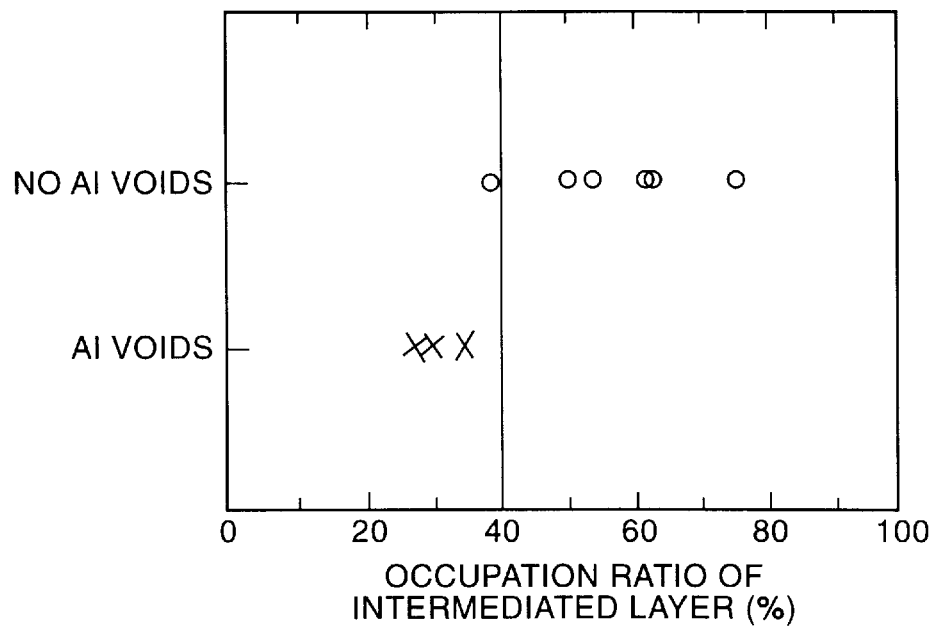
FIG. 10 is a graph showing the relationship of the occurrence and non-occurrence of Al voids with the occupation ratio of the intermediate layer which acts as the distortion relaxation layer.
Figure 11:
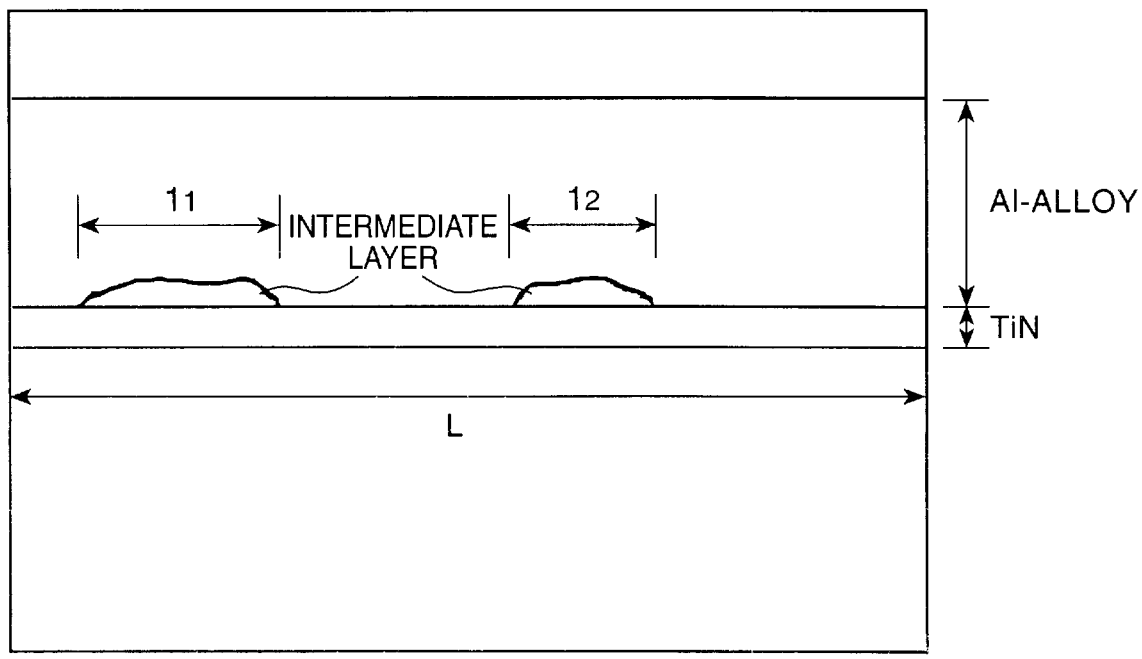
FIG. 11 is a view for showing the definition of the occupation ratio of FIG. 10.

Furthermore, the inventors used a transmission electron microscope to determine the proper occupation rate of the distortion relaxation layer, that is to be formed, at the interface of the Al alloy layer and titanium nitride layer. FIG. 10 shows the relationship of the occupation rate at the interface of the Al alloy and titanium nitride layers of the distortion relaxation layer with the presence/non-presence of Al voids. The occupation rate of the distortion relaxation layer, R, is defined as follows:

$$R = \sum l_i / L \qquad (3)$$
$$= (l_1 + l_2)/L \times 100\,(\%)$$

wherein $l_i$ (such as $l_1$, $l_2$ in FIG. 11) represents a length of each distortion relaxation layer and L represents total length of the interface between the Al alloy and titanium nitride layers as shown in FIG. 11. It must be noted here that $l_1$ and $l_2$ represent the lengths of each of the islands of the distortion relaxation layer, if it is scattered at the interface between the Al alloy and titanium nitride layers (refer to FIG. 11).

From FIG. 10, if the distortion relaxation layer covers more than 40% of the interface, it can be found that it can suppress the occurrences of Al voids.

Figure 12:
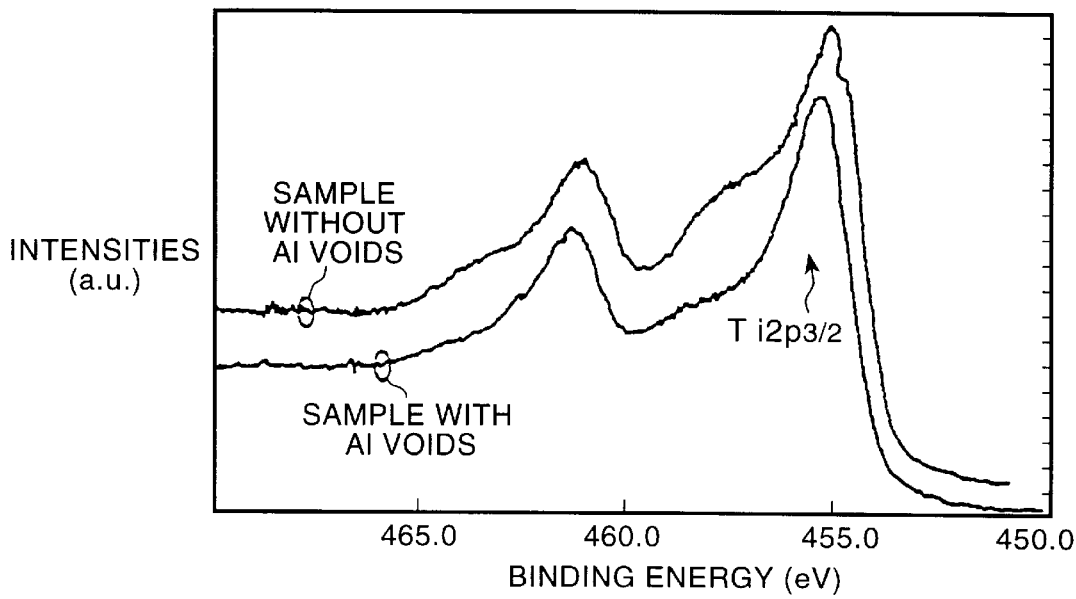
FIG. 12 is a graph showing analysis results of the titanium nitride layers obtained through X-ray photoemission spectroscopy, which shows the chemical shift that represents the chemical bonding state of Ti$^2$p$_{3/2}$.

To make clear the differences between the conditions that make Al voids happen with those conditions that suppress the occurrence of Al voids, as shown in FIG. 12, the sample that formed only the titanium nitride film was measured through X-ray photoelectron spectroscopy (XPS) with the amount of shift (chemical shift) in the binding energy for the electron in the $Ti2p_{3/2}$ level of the atom in the Ti, that is in titanium nitride (formed by the chemical bonding of Ti with nitrogen), and was also investigated. For the condition in which Al voids occurred, the chemical shift of the $Ti2p_{3/2}$ in the titanium nitride layer was 1.51 eV while the chemical shift in the titanium nitride layer for the condition that suppressed the occurrence of Al voids was smaller at 1.32 eV. The latter implies that the bonding state of nitrogen and titanium was weak and thus, it was easier for the titanium from the titanium nitride to diffuse into the Al alloy layer.

Furthermore, there is another way of evaluating the state of the titanium nitride layer. For example, forming titanium nitride in the same conditions as those for the samples marked X in FIG. 3 in which Al voids occurred, their resistivity after film formation was around 80 $\mu\Omega$cm–170 $\mu\Omega$cm. On the other hand, the resistivity for the titanium nitride, measured after its formation under the same conditions as those for the samples marked ○ in FIG. 3, was 180 $\mu\Omega$cm–1,000 $\mu\Omega$cm. In addition, measuring the film stress of the titanium nitride immediately after the film formation, the compression stress of the sample, formed in the conditions that made Al voids occur, was at a high of over 100 MPa, while the compression stress for the sample formed under the conditions that suppressed the occurrence of Al voids was relatively lower at 0–90 MPa. From this, it can be inferred that the titanium nitride raised under conditions below the boundary line in FIG. 3 has a relatively coarse film with a weak bond state for nitrogen and titanium and that titanium in titanium nitride diffuses more easily into the inside part of the Al alloy layer.

Figure 13:
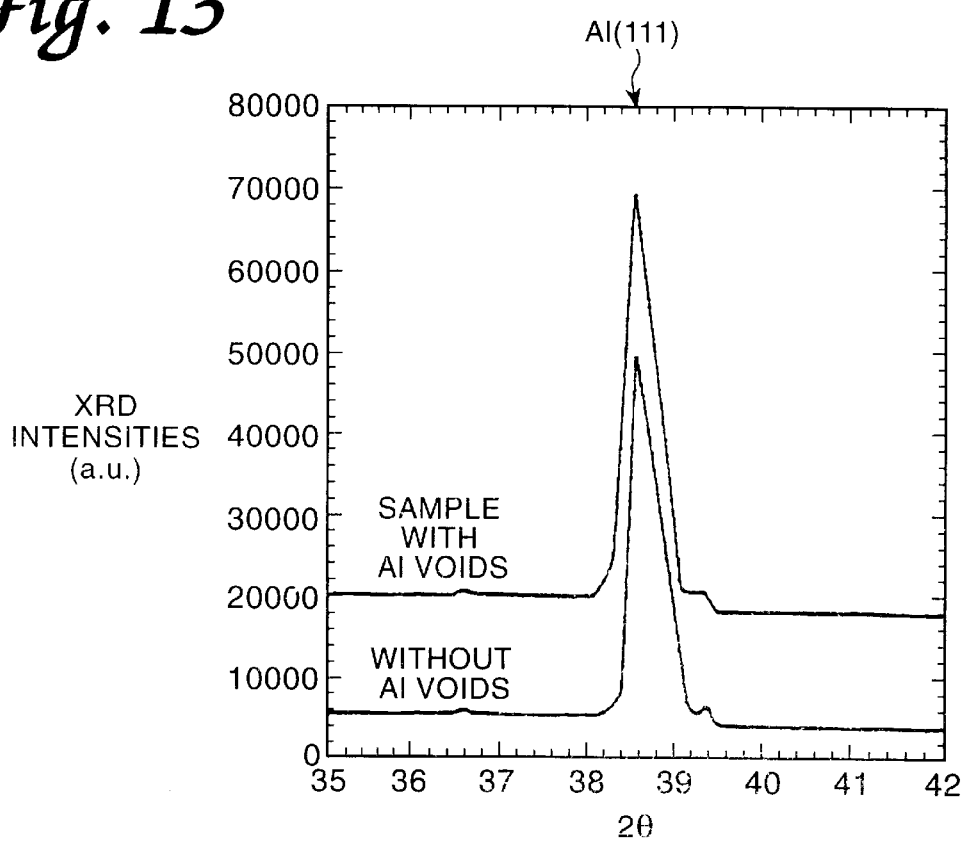
FIG. 13 is a graph showing intensities investigated the Al(111) plane of the wiring electrodes by a X-ray diffractometry.

In the past, generally, Al voids have been thought to be suppressed in the following way. In other words, for example, as shown in the metal wiring structure disclosed in JP-A-63-152147, it was thought that it was necessary for the crystal face of the Al—Si—Cu wiring to be oriented at the Al(111) plane. This method aimed to reduce the number of defects and distortions inside the interior of the Al—Si—Cu wiring and in doing so, suppress the occurrences of Al voids. However, the inventors investigated on the samples shown in FIG. 3 and performed Al alloy X-ray diffractometry on them and found out that the samples that suppressed Al voids and those wherein Al voids occurred were both oriented at the Al(111) plane and moreover, as shown in FIG. 13, in contrast to the previous proposals, the diffraction intensity was smaller for the sample that suppressed the occurrence of Al voids. Therefore, after examination, the inventors found out, as nobody ever did before, that the Al(111) orientation was not the main condition in suppressing the occurrence of Al voids.

Figure 14:
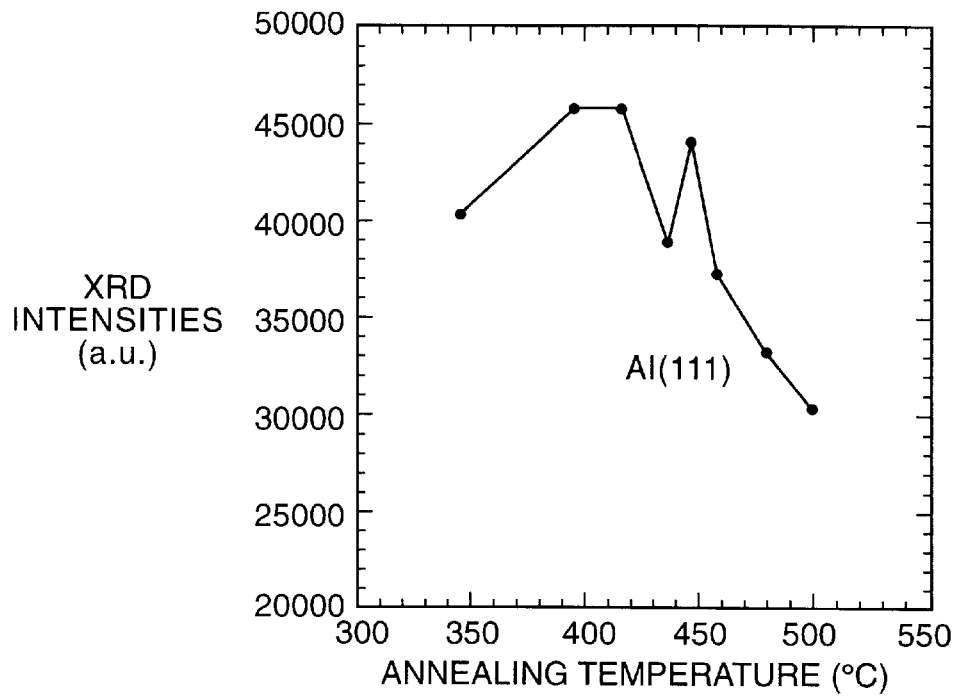
FIG. 14 is a graph showing the relationship between the X-ray diffraction intensity for the Al(111) plane of the wiring electrode and the annealing temperature.
Figure 15:
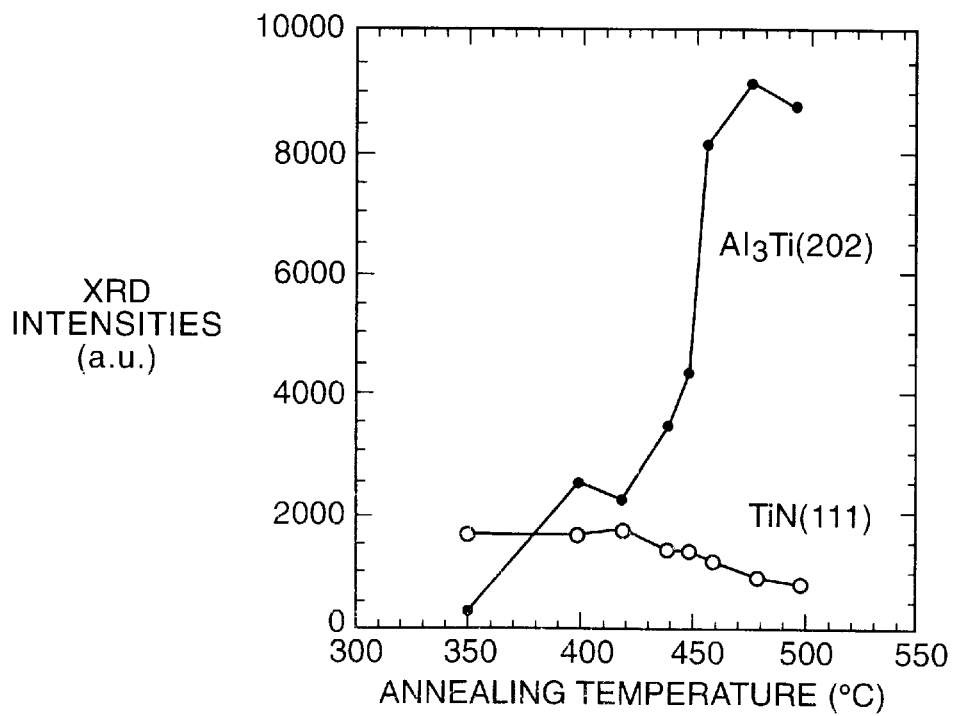
FIG. 15 is a graph showing the relationship between the X-ray diffraction intensity for the Al$_3$Ti(202) plane and the annealing temperature.

The diffraction intensities for the Al(111) and the Al$_3$Ti (202) planes for the different annealing temperatures are shown in FIGS. 14 and 15, respectively. As the annealing temperature gets higher, the diffraction intensity for Al$_3$Ti (202) plane, formed when Ti from titanium nitride layer is diffused into the Al alloy layer, gets higher, while the diffraction intensity for the Al(111) plane decreases. From this, for the sample that has the layer that contains Ti which diffused from the titanium nitride layer into the Al alloy layer, i.e., for the sample that suppressed Al voids, it was clear that the Al(111) plane orientation is smaller and that improving the orientation of the Al(111) plane would not suppress the occurrences of Al voids.

In addition, as indicated in FIG. 15, to encourage the production of Al$_3$Ti, which becomes the distortion relaxation layer 14, the annealing temperature applied to the Al alloy layer 15 after film formation should be above 350° C. and is much better if it is set above 420° C. This is because of the fact that under 350° C., the X-ray diffraction intensity of the intermetallic compound of Al and TiN was not detected and that the diffraction intensity of the same increased rapidly if the annealing temperature was over 420° C.

Next, a concrete example of this embodiment is explained below.

In FIG. 1, the interlayer insulator film 11 and the titanium layer 12 are formed on top of the silicon substrate 10, with a titanium silicide layer 16 formed between the titanium layer 12 and the silicon substrate 10. Moreover, the titanium nitride layer (barrier layer) 13, the Al alloy layer 15 composed of Al—Si(1 wt %)—Cu(0.5 wt %), and the protective film 18 made up of an insulator film, are formed on top of the titanium layer 12. Also, the distortion relaxation layer 14, which is an Al alloy layer that contains the diffused Ti, is formed at the interface of the titanium nitride layer 13 and the Al alloy layer 15.

Figure 2A:
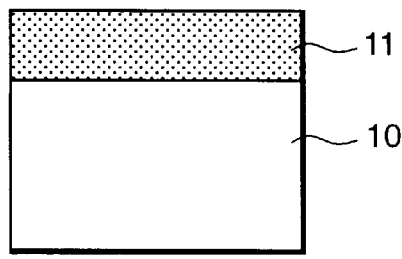
FIGS. 2A to 2E are cross-sectional views respectively showing the undergoing electrode structure at the different major manufacturing steps.
Figure 2D:
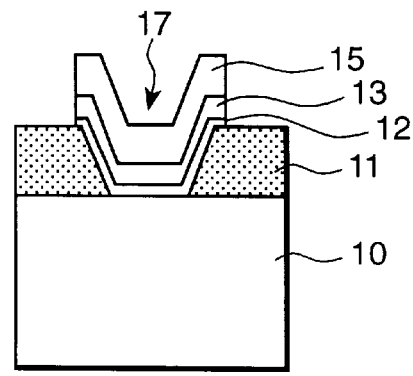
Figure 2B:
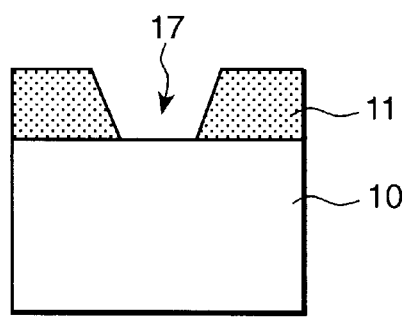

Next, FIGS. 2A through 2E are used to explain the method for manufacturing the semiconductor device shown in FIG. 1. First, as shown in FIG. 2A, the interlayer insulator film 11, such as PSG (phosphoric silicate glass) is formed using a CVD (Chemical Vapor Deposition) or sputtering method, and, as shown in FIG. 2B, a contact hole 17 is formed through photolithography to expose the surface contact area of the silicon substrate 10.

Figure 2E:
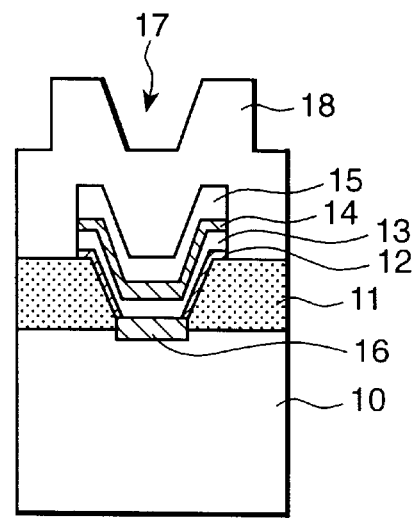
Figure 2C:
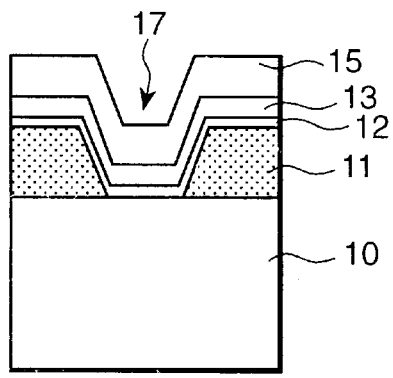

For the process shown in FIG. 2C, using the sputtering device shown in FIG. 16, a 20 nm thick titanium layer 12 is formed by sputtering, a 80 nm thick titanium nitride layer 13 is formed by the reactive sputtering of Ti inside an atmosphere of a mixture of argon and nitrogen, and a 450 nm thick Al alloy layer 15 made up of Al—Si(1 wt %)—Cu(0.5 wt %) is formed by sputtering. These layers are formed continuously and portions of them are connected electrically to the surface contact area of the silicon substrate 10. While performing the above sputtering processes, the titanium layer 12, titanium nitride layer 13 and Al alloy layer 15 are not exposed to the air and are formed continuously inside a vacuum. Therefore, the inside parts of these layers and their interfaces virtually do not contain oxygen with the oxygen concentration at below 1 at %.

The effective substrate temperature is set at a certain value during the formation of the titanium layer 12, the titanium nitride layer 13 and the Al alloy layer 15. Since the titanium nitride layer 13 is formed by making titanium react in a plasma with a N$_2$—Ar atmosphere, the conditions for forming the film, such as the effective substrate temperature, the film formation pressure, the ratio of the flow rates of N$_2$—Ar gases, the DC power density or the like, will slightly affect the chemical composition ratio, the crystal structure and the degree of diffusion of titanium from the titanium nitride layer 13 into the Al alloy layer 15. Because of this, the substrate temperature, the film formation pressure, the ratio of the flow rates of the N$_2$—Ar gases and the DC power density have been set to 300° C., 5.5 mTorr, 1:1 and 4.4 W/cm$^2$, respectively, in this embodiment.

After formation of the Al alloy layer 15, the titanium layer 12, the titanium nitride layer 13 and Al alloy layer 15 are patterned and are processed to form the Al wiring structure shown in FIG. 2D. Then, the silicon substrate 10, the titanium layer 12, the titanium nitride layer 13 and the Al alloy layer 15 are annealed at a temperature of 400° C.–480° C. to reduce the contact resistance between the substrate 10 and the Al wiring structure.

Furthermore, the insulator film, which serves as the protective film 18, is formed using a CVD or sputtering method at a temperature of 300° C.–480° C. and in doing so, a structure, like the one shown in FIG. 2E, is derived.

During the above annealing at 400–480° C. aimed at reducing the resistance of the electrical connection and during the sputtering process at 300–480° C. applied during the formation of the protective film 18, titanium diffuses from the titanium nitride layer 13 into the Al alloy layer 15 and the reactions shown in equations (1) and (2) occur to form the distortion relaxation layer 14. In this case, the distortion relaxation layer 14, in accordance with the relationship shown in FIG. 3, becomes a layer which effectively reduces the number of Al voids with widths of over 0.3 $\mu$m for every wiring width of 1 $\mu$m to 0. That is to say, the distortion relaxation layer 14 becomes a layer which can suppress the occurrence of Al voids the void width of which are over approximately one third of the wiring width.

As described above, according to the present embodiment, by forming the distortion relaxation layer 14, which is an intermetallic compound layer expressed as TiAl$_x$ composed mainly of TiAl$_3$, in between the titanium nitride layer 13 and the Al alloy layer 15, the occurrences of Al voids can be suppressed.

Because the diffusion of titanium from the titanium nitride layer 13 into the Al alloy layer 15 for the formation of the distortion relaxation layer 14 relies heavily on the film quality of titanium nitride, there are some restrictions in the conditions for the film formation. The DC power density, which, as stated in the above, affects the film quality most, should be set 5.5 W/cm$^2$ or less. During the film formation of the titanium nitride layer 13, it is desirable that the effective substrate temperature be set at 200–350° C. On the other hand, it must be noted that the bad wettability of the titanium nitride against Al and raising the substrate temperature during the film formation of Al to over 200° C. make the Al adhere to the inside of the contact hole 17. Thus, the step coverage of Al might deteriorate and because of the fact that the occurrence of Al voids may be linked to such bad wettability, it is desirable that the substrate temperature during the film formation of Al be set under 200° C., e.g. 100–150° C. Also, because the film formation pressure of the N$_2$—Ar gas is closely related to the reactivity of the reactive sputter while also affecting the life span of an exhaust pump, it should be set at 2–7 mTorr. As the gas mixture ratio of N$_2$ with Ar affects both the reactivity of the reactive sputter and the deposition rate, the partial pressure of N$_2$ gas should be set at 33–75%.

Furthermore, in this embodiment, the concentration of oxygen inside the titanium nitride layer 13, which serves as the barrier layer, is set approximately below 1 at %, while the oxygen concentration at the interface of the titanium nitride layer 13 and the distortion relaxation layer 14 is set at approximately below 1 at %. Because of the above, it is easier for Al and titanium nitride to react to each other and thus, it will be easier to form the distortion relaxation layer 14 with the designated thickness.

In this embodiment, the titanium nitride layer 13, which is used in the formation of the distortion relaxation layer 14, acts as a diffusion barrier layer to prevent Al from diffusing into the Si substrate 10 and also to prevent Si (from the Si substrate 10) and Ti (from the titanium layer 12) from diffusing into the Al alloy layer 15. Instead of the above, the following structure can also be used: metals with high melting points, nitride compounds of metals with high melting points, silicide compounds of metals with high melting points or the like, all of which can act as diffusion barrier layers, being inserted between the titanium nitride layer 13 and titanium layer 12 and/or between the titanium nitride layer 13 and the titanium silicide layer. Also, in place of the titanium silicide layer 16 and the titanium layer 12, metals with high melting points, silicide compounds of metals with high melting points and the like, can also be used.

Also, the Al alloy of the Al alloy layer 15 is not limited only to Al—Si—Cu, but other alloys, i.e. pure Al, Al—Ti—Si, Al—Cu, Al—Si, Al—Ti, Al—Cu—Ti and the like, can also be used.

In addition, the barrier, titanium silicide and titanium layers can either be multilayered or not. The only vital point, in suppressing Al voids, is that the Al alloy layer 15 and the titanium nitride layer 13, which is important in the formation of the distortion relaxation layer, are both directly in contact with each other. Besides this, there are no other restrictions on the structure, orientation and the like of the layers.

(Second Embodiment)

In the first embodiment, explained in the above, the occurrence of Al voids was suppressed by changing the traditional conditions for forming the film of the titanium nitride layer 13 and by the formation of the distortion relaxation layer 14. While this structure made certain that the occurrence of Al voids was sufficiently suppresssed, there is the problem that alloy spikes, such as Al spikes, are likely to occur.

Figure 17:
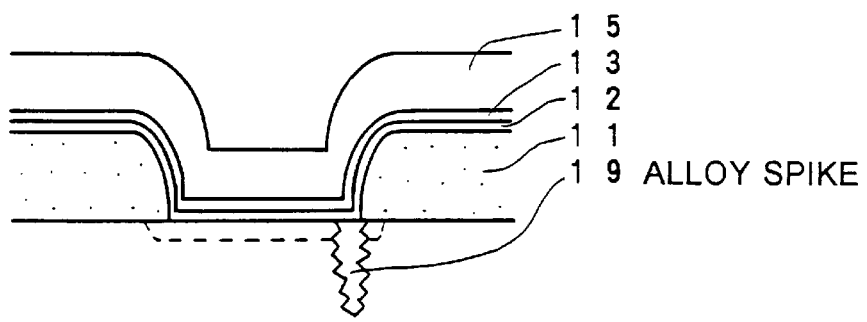
FIG. 17 is a schematic sectional view showing an occurrence of an alloy spike.

An alloy spike is, as shown in FIG. 17, a phenomenon in which the wiring materials Al, Ti and Si react to form a compound that badly affects the device's characteristics (Tr characteristics). Reflecting on this point, for the conventional method of forming the titanium nitride layer, the power density during the formation of the titanium nitride layer is relatively high and after the film formation of the titanium nitride layer, the film was exposed to the air. While, for this case, the occurrence of alloy spike was prevented by the relative hardness of TiN's film, if the power density is lowered, as in the above, to under 5.5 W/cm$^2$ to suppress the occurrence of Al voids, it can be inferred that reaction among the metals and silicon substrate is made more conducive and this results in the occurrence of alloy spike. Therefore, a conflict arises in adjusting the power density because the suppression of Al voids and the suppression of alloy spike are in a relationship that is contradictory to each other.

Thickening the film of the titanium nitride layer can be one way of suppressing the occurrence of alloy spike. In other words, by thickening the film, the formation of the compound of Al, Ti and Si, which results in alloy spike, is suppressed. However, simply thickening the titanium nitride layer can result in defects in the Al wiring like rupture.

Accordingly, the inventors propose the setting up of an alloy spike preventive layer, as distinguished from the formation of the titanium nitride layer which suppressed Al voids, between the titanium nitride layer (distortion relaxation layer) and the silicon substrate. To put it concretely, in this structure, a titanium nitride layer 20, having different characteristics than the titanium nitride layer 13, is positioned under the titanium nitride layer 13, which suppresses the occurrences of Al voids and which is in contact with the Al alloy layer. Thus, a two-layered barrier metal structure is formed. The details of the second embodiment are explained below.

Figure 18:
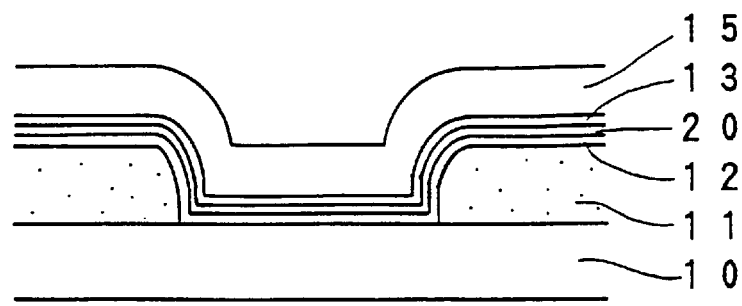
FIG. 18 is a cross-sectional view of a wiring electrode according to a second embodiment of the present invention.

FIG. 18 shows a cross-sectional view of the wiring electrode of the second embodiment. The structure shown in FIG. 18 differs with the structure shown in FIG. 1 in that the former's barrier structure is a two-layered structure which includes a titanium nitride layer 13 for forming a distortion relaxation layer and another titanium nitride layer 20 for preventing alloy spikes. But aside from this difference, both embodiments have the same structure. It must be noted here that the reaction layers of the distortion relaxation layer 14, the titanium silicide layer 16 and the protective film 18 of FIG. 1 have been omitted in FIG. 18.

Figure 19A:
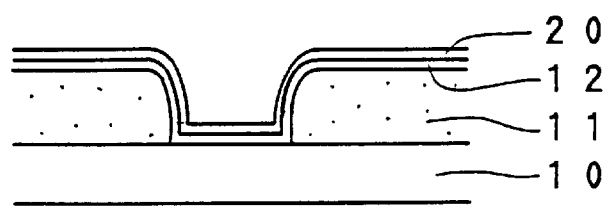
FIGS. 19A to 19C are cross-sectional views of the wiring electrode of FIG. 18, each showing a view at a major manufacturing step.
Figure 19B:
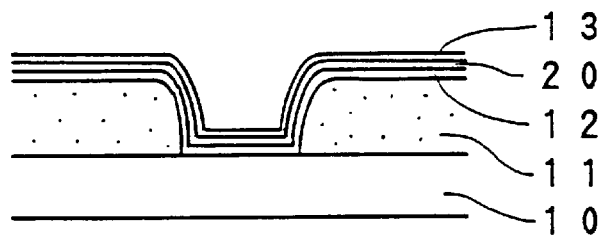
Figure 19C:
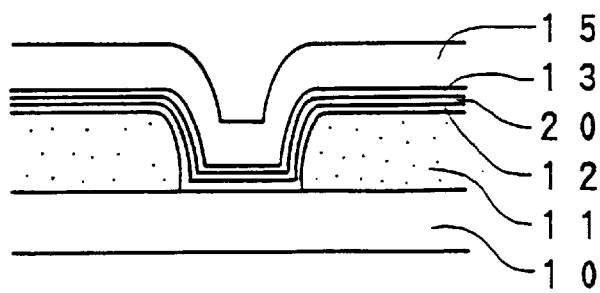

The manufacturing process for this structure is explained below. As shown in FIG. 2B, after forming the contact hole 17 on the interlayer insulator film 11, the titanium layer 12 and alloy spike preventive layer 20 are formed, as shown in FIG. 19A, through the same sputtering method as in the first embodiment. Then, as shown in FIG. 19B, the Al void preventive titanium nitride layer 13 is formed and then, as shown in FIG. 19C, an Al alloy layer 15, made up of Al—Si—Cu, is formed. It must be noted here that the same sputtering devices, used in the first embodiment, are used here and that the films were formed continuously inside a vacuum.

Then, as shown in FIGS. 2D and 2E, patterning is performed on these layers and after annealing than at a temperature of 350–480° C., preferably at 420° C. or more, the protective film 18 of an insulation film is formed thereon. Because of this annealing process, in the same way as in the first embodiment, the reaction of the titanium nitride layer 13 and the Al alloy layer 15 results in the diffusion of titanium from the titanium nitride layer 13 to the Al alloy layer 15, thereby forming a distortion relaxation layer (not shown in FIG. 18) at the interface therebetween.

Here, the conditions for the film formations of the first (underlying) titanium nitride layer 20 and the second (overlying) titanium nitride layer 13 are shown in Table 1. To make their characteristics different, the first titanium nitride layer 20 was formed at a DC power density of 8.7 W/cm$^2$ while for the second titanium nitride layer 13, the DC power density was set at 4.4 W/cm$^2$. Also, on the thickness of their films, for the first titanium nitride layer 20, it is 700 Å, while for the second titanium nitride layer 13, it is 300 Å, with their total thicknesses set to be 1,000 Å.

The second embodiment is described here by comparing it with the examples 1–3 for comparison. These examples for comparison have only one titanium nitride layer and as shown in Table 1, they have been formed under different DC power densities to make them unique to each other. Also, the thickness of their titanium nitride layers are set to be 1,000 Å, to equal the total thickness for the structure stated above that has two titanium nitride layers. On the other hand, the thickness of the titanium and Al alloy layers are set uniformly to 200 Å and 4,500 Å, respectively, for this embodiment and for the examples for comparison.

TABLE 1

|  |  | Power Density (W/cm$^2$) | Ar flow rate (SCCM) | N$_2$ flow rate (SCCM) | Pressure (mTorr) | Sub. TEMP. (° C.) |
| --- | --- | --- | --- | --- | --- | --- |
| Second Embodiment | 1st TiN | 8.7 | 90 | 90 | 5.5 | 270 |
|  | 2nd TiN | 4.4 | 90 | 90 | 5.5 | 270 |
| comparative 1 |  | 4.4 | 90 | 90 | 5.5 | 270 |
| comparative 2 |  | 5.2 | 90 | 90 | 5.5 | 270 |
| comparative 3 |  | 8.7 | 90 | 90 | 5.5 | 270 |

Figure 20:
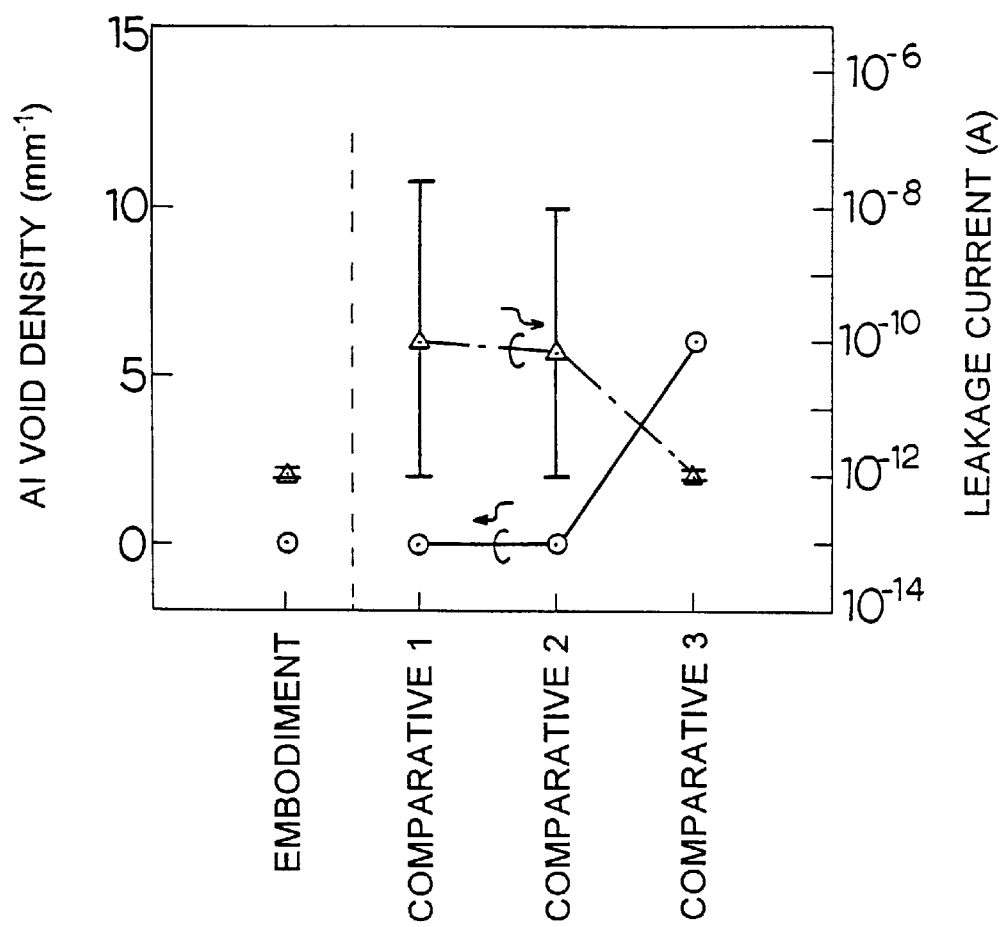
FIG. 20 is a diagram showing the comparison between the second embodiment and examples 1–3 as evaluated on the Al void density and leakage current.
Figure 21:
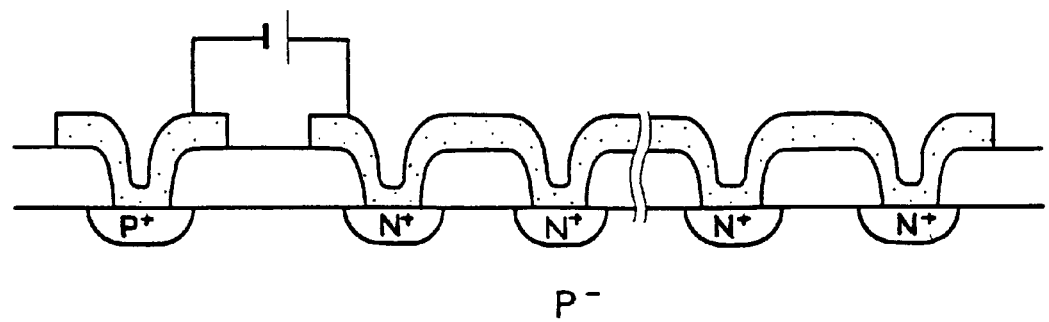
FIG. 21 is a schematic view showing the structure for measuring the leakage current.

Investigation was done on the Al void density and the leakage current of this embodiment and of the comparative examples 1–3, the result of which is shown in FIG. 20. Moreover, for the alloy spikes, investigation was done by looking into the leakage current values of the contacts (the number of contacts was 1350) using the wiring structure shown in FIG. 21. Also, for the Al voids, the number of Al voids for every 1 μm width and 1 mm long wiring, i.e., the Al void density, was evaluated.

From FIG. 20, it can be seen that while the comparative examples 1 and 2, with DC power densities of 4.4 W/cm$^2$ and 5.2 W/cm$^2$, respectively, suppressed the occurrence of Al voids, it can be inferred that alloy spikes occurred in them because of their large leakage currents. On the other hand, for comparative example 3 which has a DC power density of 8.7 W/cm$^2$, while the leakage current was small with the occurrence of the alloy spike suppressed, Al voids occurred. In this way, the suppression of Al voids and the suppression of alloy spike run contrary to each other with regards to the adjustment of the power level, and the detailed manufacturing conditions have to be optimized to satisfy both using only one titanium nitride layer. In contrast with the above, for the second embodiment which has two titanium nitride layers, the occurrence of Al voids are suppressed by the upper titanium nitride layer and by the fact that the leakage current is small, the occurrence of alloy spike is also suppressed easily by the lower titanium nitride layer.

Figure 22:
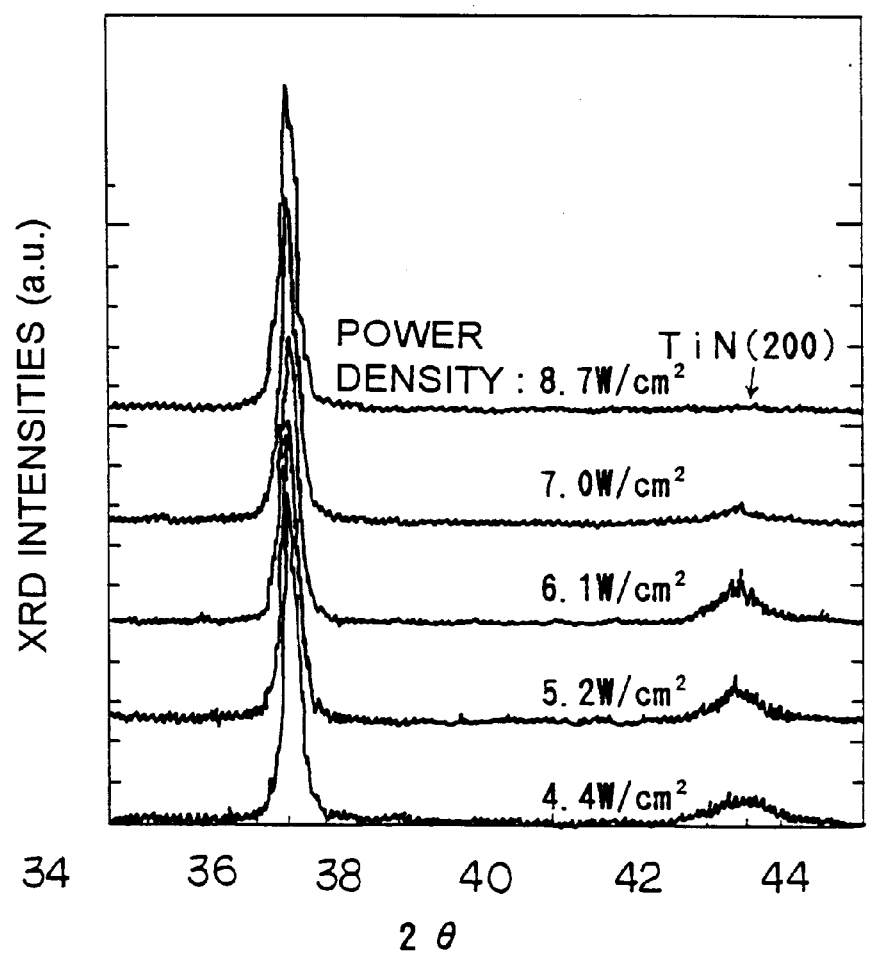
FIG. 22 is a X-ray diffraction diagram of the titanium nitride layers when varying power density during the formation thereof.

FIG. 22 shows the results of the XRD (X-ray diffractometry) analysis when the DC power density of the mono-layer titanium nitride layer is changed. From this figure, it can be seen that as the DC power density becomes larger, the orientation of TiN(200) changes. Thus, it can be considered that this difference in the physical characteristic brought about by the change in the orientation greatly contributes to the occurrences of Al voids and alloy spikes.

Figure 23:
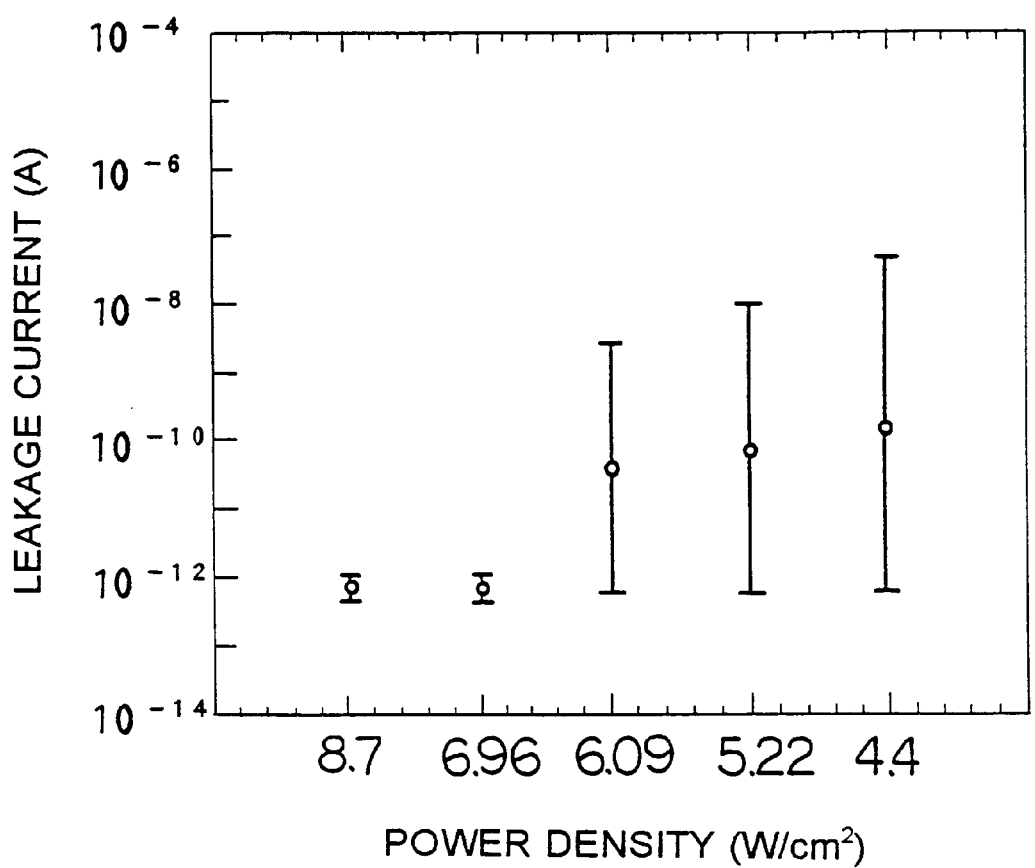
FIG. 23 is a characteristic diagram showing the relationship of the power density with the leakage current.

FIG. 23 shows the relationship of the DC power density of the mono-layer titanium nitride layer with the leakage current. From this figure, it can be seen that there is a point of displacement when the DC power density is equal to 6.96 W/cm$^2$ such that if the DC power density is larger than this amount, then the leakage current becomes smaller. Therefore, the titanium nitride layer 20 which prevents alloy spikes should be formed with a DC power density of 6.96 W/cm$^2$ or more to sufficiently suppress the occurrence of alloy spike.

Also, after the film formation, the first TiN layer 20 can be formed to have, for example, a resistivity lower than 200 μΩcm and a relatively higher compressive stress above 100 Mpa. Meanwhile, as was explained in the first embodiment noted above, immediately after the film formation, it is desirable for the second TiN layer 13, which contributes to the formation of the distortion relaxation layer which suppresses the occurrence of Al voids, to have a resistivity of 180–1,000 μΩcm and a film stress of 0–90 Mpa.

Figure 24A:
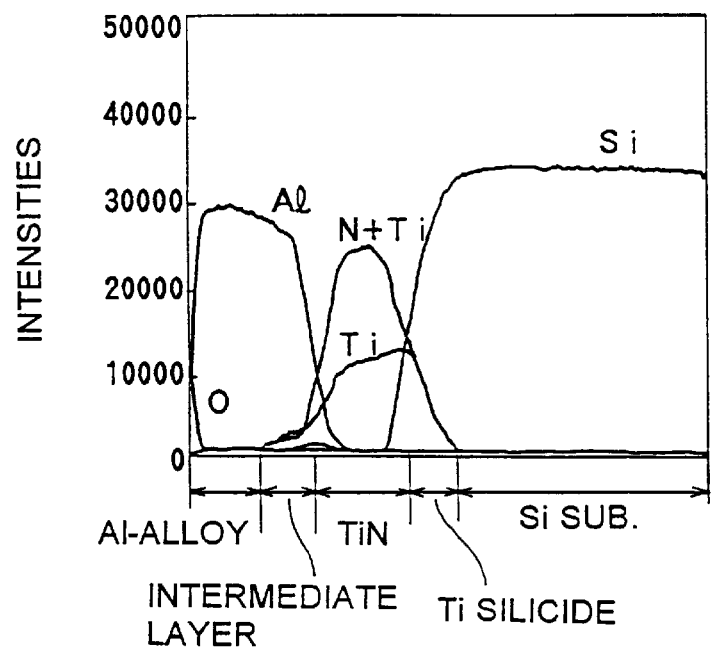
Figure 24B:
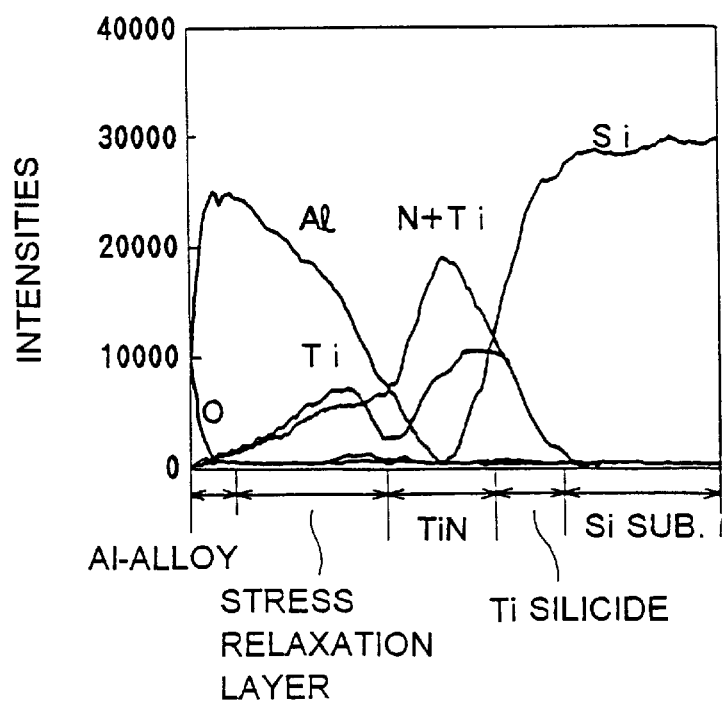

Next, it will be explained here how the different film formation conditions, as shown in Table 1, bring about different characteristics for the same titanium nitride layer. FIGS. 24A and 24B show the results of the analysis of the composition, taken along different depths (along the depths of the portions were the interlayer insulator film was not formed) with an Auger Electron Spectroscopic device. FIG. 24A shows the composition when a titanium layer 12, a titanium nitride layer 20 for the prevention of alloy spike and an Al layer 15 are formed on top of the silicon substrate 10. On the other hand, FIG. 24B shows the composition when a titanium layer 12, a titanium nitride layer 13 for the prevention of Al voids and an Al layer 15 are formed on top of the silicon substrate 10. From these figures, it can be seen that both have different physical characteristics. Meanwhile, when an Al layer 15 is formed on top of a titanium nitride layer 20, which prevents alloy spike, a thin reaction layer is formed due to the reaction of both layers. However, this reaction layer, as stated in the above, is very thin and thus, does not contribute to the suppression of Al voids.

Figure 25:
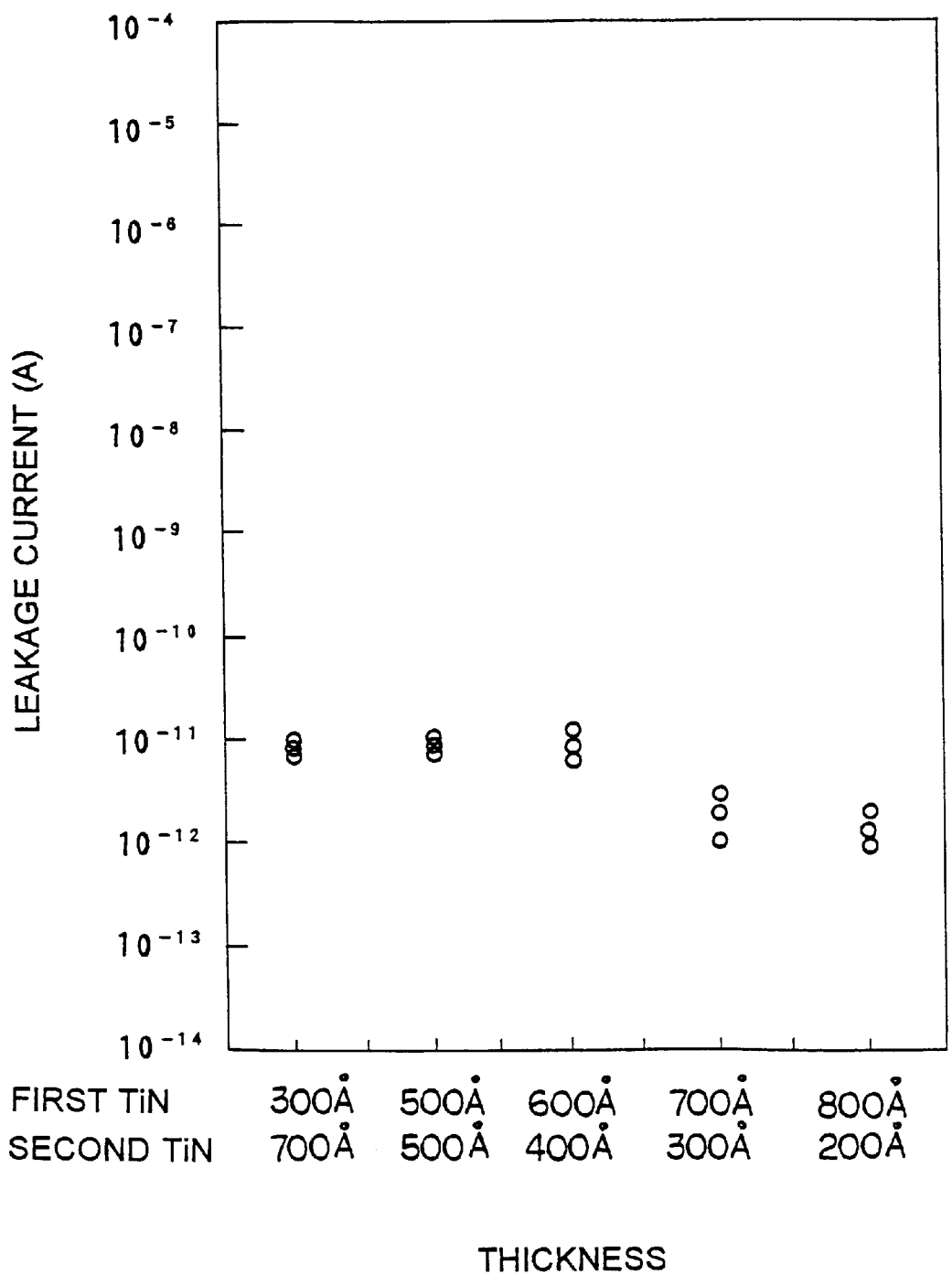
FIG. 25 is a graph showing the occurrence of leakage currents when the film thickness of the first and second titanium nitride layers are varied.
Figure 26:
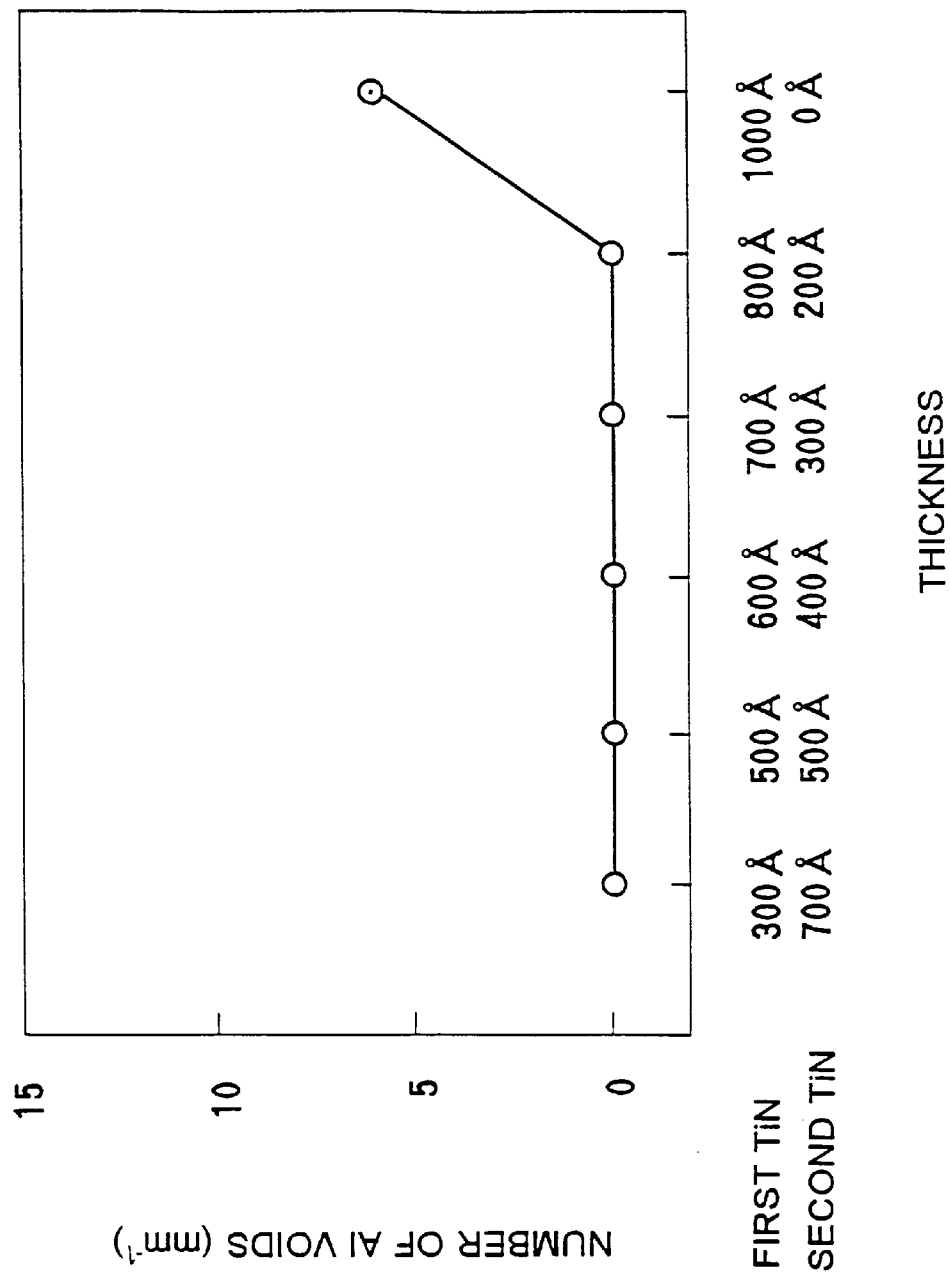
FIG. 26 is a graph showing the occurrence of Al voids when the thickness of the first and second titanium nitride layers are varied.

Next, the effects of the thicknesses of the films of the first titanium nitride layer 20 and the second titanium layer 13 on the leakage current and the occurrence of Al voids are explained. The results are shown in FIGS. 25 and 26. From these figures, it can be seen that good results with the leakage current and the Al voids are achieved even when the ratio of the thicknesses of these two layers are changed. Thus, for the two titanium nitride layers, even if one of the layers is formed thinly, both layers will still work effectively.

While the same material used in forming the titanium nitride layer 13, which prevents Al voids, was used in forming the titanium nitride layer 20, titanium tungsten (TiW), tungsten silicide (WSi$_x$), molybdenum silicide (MoSi$_x$) can also be used to form the layer for the prevention of alloy spike. However, as in the second embodiment above, if the titanium nitride layer 13 of the same material as the titanium nitride layer 20 is made, then, both can be made in a continuous process and since their etching processes can be done with the same method, then there is the merit of being able to simplify the manufacturing process.

Moreover, while the first and second titanium nitride layers 20 and 13 were formed while changing the DC power density during the film formation of the titanium nitride, the DC power density can also be reduced gradually as the film formation process of the titanium nitride progresses. For such case, the sputtering condition must be controlled so that the DC power density at the start of the film formation process should be above 6.96 W/cm$^2$ and that the DC power density at the completion of the film formation process should be below 5.5 W/cm$^2$.

In addition, it is not necessary for the alloy spike preventive layer 20 to be formed continuously with titanium nitride layer 13 that prevents Al voids. Such alloy spike preventive layer can be formed at some place between the titanium nitride layer 13 and the silicon substrate 10. For example, the titanium layer, the titanium nitride layer 20 (which prevents alloy spike) and the titanium layer, all these three layers, can be placed in between the silicon substrate 10 and the titanium nitride layer 13.

While the present invention has been shown and described with reference to the foregoing preferred embodiments, it will be apparent to those skilled in the art that changes in form and detail may be made therein without departing from the scope of the invention as defined in the appended claims.

What is claimed is:

1. An electrode for a semiconductor device, comprising:
   a semiconductor substrate;
   an interlayer insulator film having a contact hole formed on said semiconductor substrate;
   a titanium nitride barrier layer formed on said interlayer insulator film so as to contact said semiconductor substrate via said contact hole, said barrier layer having a portion disposed in said contact hole and a portion disposed outside said contact hole;
   an aluminum wiring layer formed on said barrier layer; and
   a distortion relaxation layer having a portion disposed in said contact hole and a portion disposed outside said contact hole, with said portion outside said contact hole covering more than 40% of said portion of said barrier layer disposed outside said contact hole, said portion outside said contact hole having a film thickness of at least 10 nm and being either an Al$_3$Ti layer or an intermetallic compound layer that includes Al$_3$Ti, said distortion relaxation layer being located at an interface between said barrier layer and said aluminum wiring layer.

2. The electrode as claimed in claim 1, wherein an oxygen concentration inside said barrier layer is approximately below 1 at % and an oxygen concentration at an interface of said barrier layer and said distortion relaxation layer is approximately below 1 at %.

3. The electrode as claimed in claim 1, further comprising an alloy spike preventive layer, for the prevention of alloy spike, located between said barrier layer and said semiconductor substrate.

4. The electrode as claimed in claim 3, wherein said barrier layer and said alloy spike preventive layer are titanium nitride layers but have different film characteristics from each other.

5. The electrode of claim 1, wherein said distortion relaxation layer has a film thickness that substantially reduces to zero the number of Al voids in said portion of said aluminum wiring layer outside of said contact hole occurring as a result of stress migrations that have void widths of over approximately one third of a wiring width.

6. The electrode of claim 1, wherein said barrier layer completely covers said portion of said titanium nitride layer outside of said contact hole.

7. The electrode of claim 1, wherein said relaxation layer is formed from said barrier layer and said aluminum wiring layer.

8. An electrode for a semiconductor device, comprising:
   a semiconductor substrate;
   an interlayer insulator film having a contact hole formed on said semiconductor substrate;
   a titanium nitride barrier layer formed on said interlayer insulator film to contact said semiconductor substrate via said contact hole;
   an aluminum wiring layer formed on said barrier layer; and
   a distortion relaxation layer of an intermetallic compound which includes aluminum and titanium in composition thereof, disposed at an interface between said barrier layer and said aluminum wiring layer, said relaxation layer covering more than 40% of said barrier layer lying outside of said contact hole and having a film thickness that substantially reduces to zero Al voids in a portion of said aluminum wiring layer outside of said contact hole occurring as a result of stress migrations that have void widths of over approximately one third of a wiring width.

9. The electrode as claimed in claim 8, wherein said distortion relaxation layer is either an Al$_3$Ti layer or an intermetallic compound layer that contains a substantial proportion of Al$_3$Ti.

10. The electrode as claimed in claim 8, wherein an oxygen concentration inside said barrier layer is approximately below 1 at % and an oxygen concentration at an interface of said barrier layer and said distortion relaxation layer is approximately below 1 at %.

11. The electrode as claimed in claim 8, further comprising an alloy spike preventive layer, for the prevention of alloy spike, located between said barrier layer and said semiconductor substrate.

12. The electrode as claimed in claim 11, wherein said barrier layer and said alloy spike preventive layer are titanium nitride layers but have different film characteristics from each other.

13. The electrode as claimed in claim 1, further comprising a titanium layer interposed between said interlayer insulator film and said titanium nitride layer, and wherein said titanium nitride layer contacts said semiconductor substrate via said titanium layer.

14. The electrode as claimed in claim 8, further comprising a titanium layer interposed between said interlayer insulator film and said titanium nitride layer, and wherein said titanium nitride layer contacts said semiconductor substrate via said titanium layer.

15. The electrode of claim 8, wherein said barrier layer completely covers said portion of said titanium nitride layer outside of said contact hole.

16. The electrode of claim 8, wherein said relaxation layer is formed from said barrier layer and said aluminum wiring layer.

17. An electrode, comprising:
   a semiconductor substrate;
   an interlayer insulator film having a contact hole formed on said semiconductor substrate;

a titanium nitride barrier layer formed on said interlayer insulator film to contact said semiconductor substrate via said contact hole, said barrier layer having a portion disposed within said contact hole and a portion disposed outside said contact hole;

an aluminum wiring layer formed on said barrier layer; and a distortion relaxation layer having a portion disposed in said contact hole and a portion disposed outside said contact hole, said portion disposed outside said contact hole having a film thickness of at least about 10 nm, said distortion layer being of an intermetallic compound which includes aluminum and titanium in composition thereof and being located at an interface between said barrier layer and said aluminum wiring layer, said distortion relaxation layer having a portion disposed outside said contact hole that covers more than 40% of said portion of said barrier layer outside said contact hole;

wherein an oxygen concentration inside said barrier layer is approximately below 1 at % and an oxygen concentration at an interface of said barrier layer and said distortion relaxation layer is approximately below 1 at %.

18. The electrode as claimed in claim 17, further comprising an alloy spike preventive layer, for the prevention of alloy spike, located between said barrier layer and said semiconductor substrate.

19. The electrode of claim 17, wherein said barrier layer completely covers said portion of said titanium nitride layer outside of said contact hole.

20. The electrode of claim 17, wherein said relaxation layer is formed from said barrier layer and said aluminum wiring layer.

21. An electrode for semiconductor device, comprising:

a semiconductor substrate;

an interlayer insulator film having a contact hole formed on said semiconductor substrate;

a titanium nitride barrier layer formed on said interlayer insulator film so as to contact said semiconductor substrate via said contact hole;

an aluminum wiring layer formed on said barrier layer; and a distortion relaxation layer of an intermetallic compound which includes aluminum and titanium in composition thereof, disposed at an interface between said barrier layer and said aluminum wiring layer, and having a film thickness that substantially reduces to 0 the number of Al voids that have void widths of over approximately one third of a wiring width;

further comprising an alloy spike preventive layer, for the prevention of alloy spike, located between said barrier layer and said semiconductor substrate;

wherein said barrier layer and said alloy spike preventive layer are titanium nitride layers but have different film characteristics from each other; and wherein an orientation of the titanium nitride layer comprising said barrier layer has a greater orientation in the (200) direction than the titanium nitride layer comprising said alloy spike preventive layer.

22. An electrode for semiconductor device, comprising:

a semiconductor substrate;

an interlayer insulator film having a contact hole formed on said semiconductor substrate;

a titanium nitride barrier layer formed on said interlayer insulator film so as to contact said semiconductor substrate via said contact hole;

an aluminum wiring layer formed on said barrier layer; and a distortion relaxation layer, which has a film thickness of at least about 10 nm, of an intermetallic compound which includes aluminum and titanium in composition thereof said distortion relaxation layer being located at an interface between said barrier layer and said aluminum wiring layer;

wherein said distortion relaxation layer is either an $Al_3Ti$ layer or an intermetallic compound layer that contains a substantial portion of $Al_3Ti$;

further comprising an alloy spike preventive layer, for the prevention of alloy spike, located between said barrier layer and said semiconductor substrate;

wherein said barrier layer and said alloy spike preventive layer are titanium nitride layers but have different film characteristics from each other; and wherein an orientation of the titanium nitride layer comprising said barrier layer has a greater orientation in the (200) direction than the titanium nitride layer comprising said alloy spike preventive layer.

23. An electrode for a semiconductor device, comprising:

a semiconductor substrate;

an interlayer insulator film formed on said semiconductor substrate and including a substrate contact hole;

a titanium nitride layer formed on said interlayer insulator film;

an aluminum wiring layer formed on said titanium nitride layer; and a distortion relaxation layer having a film thickness of at least 10 nm and including a compound selected from the group consisting of $Al_3Ti$ and an intermetallic compound layer that includes $Al_3Ti$, said distortion relaxation layer being located at an interface between said titanium nitride layer and said aluminum wiring layer and covering more than 40% of said titanium nitride layer lying outside of said contact hole.

24. The electrode of claim 23, wherein an oxygen concentration inside said titanium nitride layer is approximately below 1 at % and an oxygen concentration at said interface of said titanium nitride layer and said distortion relaxation layer is approximately below 1 at %.

25. The electrode of claim 23, wherein said barrier layer completely covers said portion of said titanium nitride layer outside of said contact hole.

26. The electrode of claim 23, wherein said relaxation layer is formed from said titanium nitride layer and said aluminum wiring layer.

* * * * *